(12) United States Patent
Wieduwilt et al.

(10) Patent No.: US 11,557,367 B2
(45) Date of Patent: Jan. 17, 2023

(54) MODIFYING MEMORY BANK OPERATING PARAMETERS

(71) Applicant: Micron Technology, Inc., Boise, ID (US)

(72) Inventors: Christopher G. Wieduwilt, Boise, ID (US); Alan J. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/317,221

(22) Filed: May 11, 2021

(65) Prior Publication Data

US 2021/0335443 A1 Oct. 28, 2021

Related U.S. Application Data

(62) Division of application No. 16/805,049, filed on Feb. 28, 2020, now Pat. No. 11,011,250, which is a division of application No. 16/164,156, filed on Oct. 18, 2018, now Pat. No. 10,600,496.

(51) Int. Cl.
*G11C 7/00* (2006.01)
*G11C 29/44* (2006.01)
*G11C 16/10* (2006.01)
*G11C 16/08* (2006.01)

(52) U.S. Cl.
CPC ........... *G11C 29/44* (2013.01); *G11C 16/08* (2013.01); *G11C 16/107* (2013.01); *G11C 2029/4402* (2013.01); *G11C 2229/763* (2013.01)

(58) Field of Classification Search
CPC ................................................ G11C 29/44
USPC ................................................... 365/201
See application file for complete search history.

(56) References Cited

U.S. PATENT DOCUMENTS

| 10,600,496 | B1 | 3/2020 | Wieduwilt et al. | |
|---|---|---|---|---|
| 2005/0024948 | A1 | 2/2005 | Kanamitsu et al. | |
| 2005/0024978 | A1 | 2/2005 | Ronen | |
| 2007/0263476 | A1 | 11/2007 | Bhushan et al. | |
| 2008/0304347 | A1 | 12/2008 | Kenkare et al. | |
| 2009/0043975 | A1* | 2/2009 | Louie | G11C 29/028 711/E12.001 |
| 2010/0199138 | A1 | 8/2010 | Rho | |
| 2012/0120735 | A1* | 5/2012 | Kubouchi | G11C 29/028 365/189.05 |
| 2013/0265815 | A1* | 10/2013 | Kim | G11C 29/789 365/96 |
| 2016/0260499 | A1 | 9/2016 | Walker et al. | |
| 2018/0137913 | A1 | 5/2018 | Kim | |

* cited by examiner

*Primary Examiner* — Hoai V Ho
(74) *Attorney, Agent, or Firm* — Holland & Hart LLP

(57) ABSTRACT

Methods, systems, and devices for modifying memory bank operating parameters are described. Operating parameter(s) may be individually adjusted for memory banks or memory bank groups within a memory system based on trimming information. The local trimming information for a memory bank or memory bank group may be stored in a fuse set that also stores repair information for the particular memory bank or in a fuse set that also stores repair information for a memory bank in the particular memory bank group. The local trimming information may be applied to operating parameters for particular memory banks or memory bank groups relative to or instead of global adjustments applied to operating parameters of multiple or all of the memory banks in the memory system.

20 Claims, 9 Drawing Sheets

MODIFYING MEMORY BANK OPERATING PARAMETERS

CROSS REFERENCE

The present Application for Patent is a divisional of U.S. patent application Ser. No. 16/805,049 by Wieduwilt, et al., entitled "MODIFYING MEMORY BANK OPERATING PARAMETERS", filed Feb. 28, 2020, which is a divisional of U.S. patent application Ser. No. 16/164,156 by Wieduwilt, et al., entitled "MODIFYING MEMORY BANK OPERATING PARAMETERS", filed Oct. 18, 2018, assigned to the assignee hereof, and each of which is expressly incorporated by reference in its entirety herein.

BACKGROUND

The following relates generally to operating a memory system and more specifically to modifying memory bank operating parameters.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory (e.g., FeRAM, PCM, RRAM) may maintain their stored logic state for extended periods of time even in the absence of an external power source. Volatile memory devices (e.g., DRAM) may lose their stored state over time unless they are periodically refreshed by an external power source.

DETAILED DESCRIPTION

Figure 1:
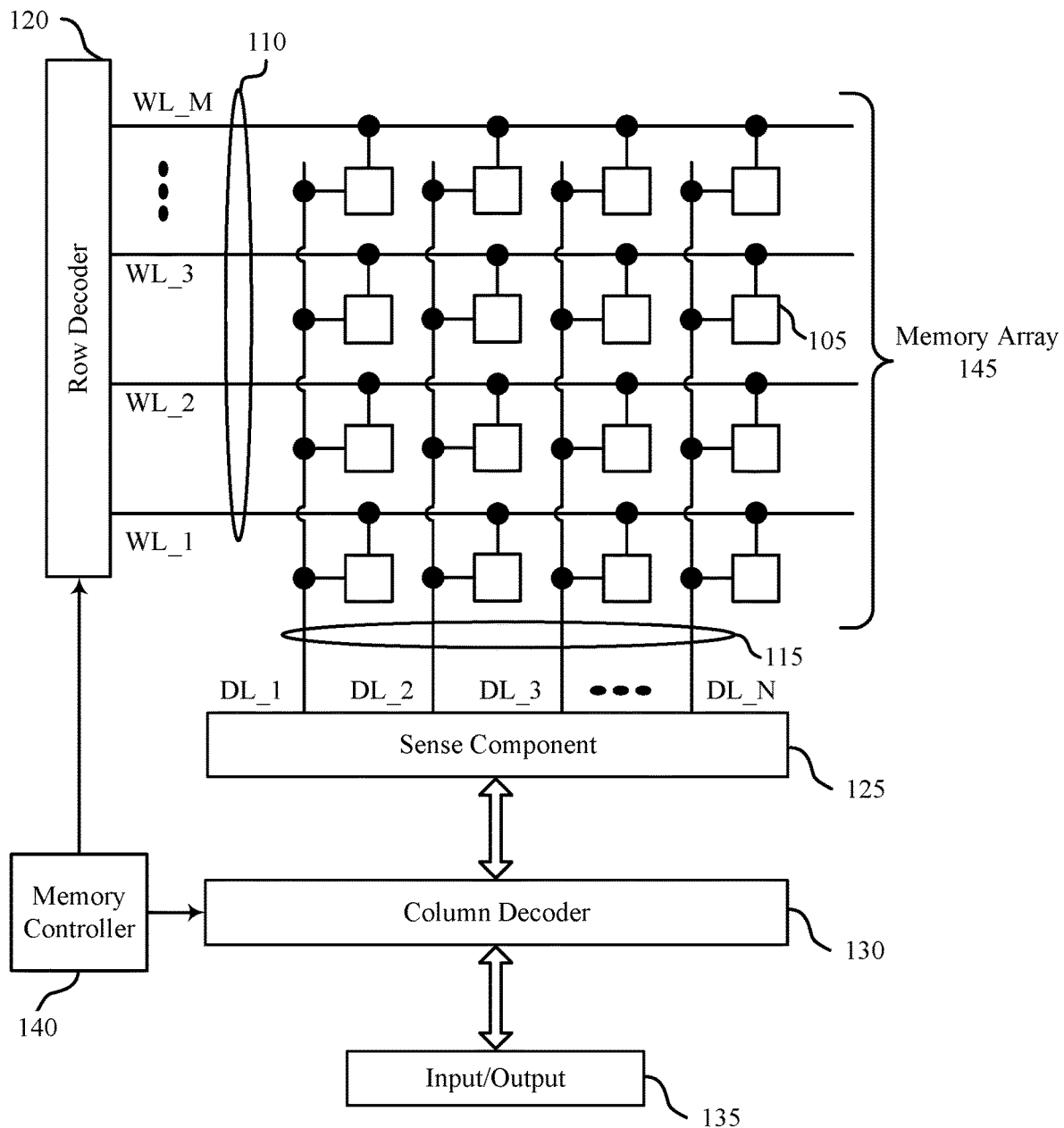
FIG. 1 illustrates aspects of an exemplary memory system that supports modifying memory bank operating parameters in accordance with various aspects of the present disclosure.

Operating parameters for a memory system may be modified from a first (e.g., default) setting to increase the overall performance of the memory system. In some cases, the modifications increase the performance of some memory banks in the memory system while providing minimal benefit to, or even hindering, the performance of other memory banks in the memory system.

One physical implementation of a memory system design (a first memory system) may differ from another physical implementation of the same memory system design (a second memory system), for example, due to manufacturing process variations. For instance, voltages and currents that may be ideal for operating components of the first memory system and/or propagation delays within the first memory system may be different than the ideal operating voltages and currents and/or propagation delays within the second memory system. Thus, voltages, currents, and/or timings of applied voltages and currents that successfully operate the first memory system—e.g., voltage, currents, and/or timings that yield a desired error rate for read/write operations—may result in undesirable operating results for the second memory system.

To compensate for physical differences in different memory systems of a same design, internal characteristics of the different memory systems may be modified so that voltages, currents, and/or timings that are more desirable for a particular memory system are used to operate the particular memory system. In some cases, delay elements within a memory system may be activated to adjust a timing of applied voltage and currents in the memory system. Additionally or alternatively, output voltages of drivers within a memory system may be adjusted to increase or decrease a magnitude of voltages applied to components within the memory system. Such adjustments to the internal characteristics of a memory system may be referred to as "trims." By adjusting the internal characteristics of the different memory systems, each of the different memory systems may be operated using the same external voltages, currents, and timings while applying tailored voltages, currents, and timing to components within the different memory systems—e.g., voltage, currents and timings that result in enhanced operation of the different memory systems. Adjustments for a memory system may be saved, and may be referred to as "trimming information."

Another difference between a first memory system and a second memory system of a same design may be the existence of different defective components, for examples, due to manufacturing process variations or user-specific operations. To accommodate for defects, each memory system may identify defective components (e.g., during a testing operation). And after identifying any defect components, the memory system may determine memory addresses corresponding to the defective components. The memory addresses may be saved and used to indicate that the corresponding component are defective if a read/write request is received for one of the memory addresses. The saved memory address may be referred to as "repair information."

In some cases, the trimming information and repair information may be stored within a memory system itself. During operation of the memory system, the trimming information may be provided to relevant locations in the memory system to adjust operating parameters (which may also be referred to as access parameters) within the memory system. Also, the repair information may be provided to relevant locations in the memory system to indicate when a requested memory address corresponds to a defective memory address within the memory system. In some examples, the trimming information and repair information is stored in fuses. In some cases, certain repair information may be longer than other repair information—e.g., more bits may be used to convey certain memory addresses over other memory address. Accordingly, more fuses may be used to store longer repair information than shorter repair information.

Some memory system designs include multiple memory banks and a fuse array to store the trimming and repair information. The fuse array may be partitioned into sets of fuses (or "fuse sets"), which may each store a trimming or repair information. In some cases, a portion of the fuse sets store trimming information (or "option fuses") for the memory system and another portion of the fuse sets store repair information (or "repair fuses") for the memory system. In some cases, the fuses sets are sized so that each fuse set is capable of accommodating the largest repair information. In some examples, the trimming information is common to all of the memory banks and used to apply the same operating parameter adjustments to each of the memory banks. In some cases, the trimming information is selected to enhance the overall performance of the memory system, while the repair information may be unique to a particular memory bank.

In some cases and similar to the discussion above, the characteristics of one memory bank may differ from another memory bank in a memory system including multiple memory banks. Thus, voltages, currents, and timings that yield desirable results for one memory bank may yield diminished results from another memory bank. In some cases, using the same trimming information for each of the memory bank (or "global trimming information") results in enhanced operation for some or a majority of memory banks while providing minimal benefits to, or even hindering, the performance of other memory banks.

To enhance the performance of individual memory banks in a memory system, trimming information may be determined and stored for each memory bank or a group of memory banks in the memory system (or "local trimming information"). To store per-memory bank trimming information, multiple fuse sets may be dedicated to the different memory banks—e.g., a first fuse set may store trimming information for a first memory bank, a second fuse set may store trimming information for a second memory bank, and so on. Similarly, to store per-memory bank group trimming information, multiple fuse sets may be dedicated to the different memory bank groups—e.g., a first fuse set may store trimming information for a first memory bank group, a second fuse set may store trimming information for a second memory bank group, and so on.

But dedicating entire fuse sets to store trimming information for individual memory banks or memory bank groups may increase the size of a fuse array and/or decrease the memory density of a memory system.

As discussed above, fuse sets may be configured to accommodate the largest type of repair data. Accordingly, when a fuse set stores a smaller type of repair data for a particular memory bank, certain fuses within the fuse set may be unused. To avoid decreasing the memory density of a memory system, local trimming information may be stored in a fuse set with repair information for a memory bank—e.g., by storing trimming information for the memory bank in unused fuses of a fuse set storing smaller type of repair information for the memory bank. Similarly, trimming information for a memory bank group may be stored with repair information for a memory bank in the memory bank group. Accordingly, the per-memory bank or per-memory bank group local trimming information may be broadcast to a relevant memory bank with the repair information.

In some cases, local trimming information may be used in combination with global trimming information to adjust operating parameters of individual memory banks or memory bank groups. For example, a memory bank that would benefit from additional operating parameter adjustments may be identified after global trimming information is applied to all of the memory banks in a memory system. Accordingly, local trimming information may be determined for the memory bank and stored in a fuse set corresponding to the memory bank. The local trimming information may then be broadcast to the memory bank and used to override or supplement the global operating parameter adjustments For example, the memory bank may apply a different operating parameter adjustment based on the local trimming information—in this way, an alternative operating parameter adjustment may be applied to the memory bank. Or the operating parameters for the memory bank may be adjusted relative to the global operating parameter adjustment—in this way, the operating parameters of memory banks may be adjusted with a higher resolution or according to more options.

Aspects of the disclosure introduced above are further described below in the context of a memory system. Specific examples are then described of a fuse array, memory bank, and memory bank operation that supports modifying memory bank operating parameters. Aspects of the disclosure are further illustrated by and described with reference to apparatus diagrams, system diagrams, and flowcharts that relate to modifying memory bank operating parameters.

FIG. 1 illustrates aspects of an exemplary memory system that supports modifying memory bank operating parameters in accordance with various aspects of the present disclosure. Memory system 100 may be used to store digital information (e.g., binary information) and may also be referred to as an electronic memory apparatus. Memory system 100 includes row decoder 120, sense component 125, column decoder 130, input/output 135, memory controller 140, and memory array 145.

Memory array 145 may include memory cells, such as memory cell 105, access lines 110, and digit lines 115. Memory cells may be programmable to store different states. For instance, memory cell 105 may be programmable to store two states, denoted as a logic 0 and a logic 1. In some cases, memory cell 105 is configured to store more than two logic states.

A memory cell 105 may include a memory element having programmable states. A memory cell 105 in a DRAM or FeRAM architecture may store a charge representative of the programmable states in a capacitor; for example, a charged and uncharged capacitor may represent two logic states, respectively. DRAM architectures may commonly use such a design and may use a capacitor including a dielectric material and having linear electric polarization properties as a memory element. FeRAM architectures may also use such a design, but the capacitor used as the memory element may include a ferroelectric material with non-linear polarization properties. A memory cell 105 in a PCM or segregation based memory (SBM) architecture may change a resistivity (e.g., resistance or threshold voltage) of a material where different resistivity may represent different logic states. PCM and/or SBM architectures may use chalcogenide materials having electronically programmable resistances as memory elements. In some cases, a memory cell 105 in a PCM architecture is programmed by changing a phase of a memory material. In some cases, a memory cell 105 in an SBM architecture is programmed by causing ion movement within a memory material.

Operations such as reading and writing may be performed on memory cells 105 by activating or selecting the appropriate access line 110 and digit line 115. Access lines 110 may also be referred to as word lines 110 or row lines 110 and digit lines 115 may also be referred to as bit lines 115 or column lines 115. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell (e.g., a capacitor) may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory system 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_3 and DL_N, the memory cell 105 at their intersection may be accessed.

Upon accessing, a memory cell 105 may be read, or sensed, by sense component 125 to determine the stored state of the memory cell 105. For example, after accessing the memory cell 105, the capacitor of memory cell 105 may discharge onto its corresponding digit line 115. Discharging the capacitor may be based on biasing, or applying a voltage, to the capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. With respect to a memory cell 105 that includes a ferroelectric capacitor, reading the memory cell may include biasing—e.g., applying a voltage to—a plate of the ferroelectric capacitor.

The reliability of a sensing operation may be dependent on a sensing window that results from reading the memory cell 105. For instance, a larger sensing window may be associated with fewer bit errors than a smaller sensing window. The sensing window may be determined as the difference between a voltage of a digit line 115 resulting from reading a memory cell 105 when storing a logic 1 and a the voltage of the digit line 115 resulting from reading the memory cell when storing a logic 0. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115. As discussed herein, activating a word line 110 electrically connects the corresponding row of memory cells 105 to their respective digit lines 115. By controlling the relevant digit line 115 while the word line 110 is activated, a memory cell 105 may be written—e.g., a logic value may be stored in the memory cell 105. Column decoder 130 may accept data, for example input 135, to be written to the memory cells 105.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory system 100. In general, the amplitude, shape, or duration of an applied voltage discussed herein may be adjusted or varied and may be different for the various operations for operating memory system 100. Furthermore, one, multiple, or all memory cells 105 within memory system 100 may be accessed simultaneously; for example, multiple or all cells of memory system 100 may be accessed simultaneously during a reset operation in which all memory cells 105, or a group of memory cells 105, are set to a single logic state.

In some examples, memory system 100 may be formed on an integrated circuit. An integrated circuit may include multiple copies of an electronic circuit on a single semiconductor material. For example, an integrated circuit may include multiple physical copies of memory system 100.

An integrated circuit including multiple physical copies of an electronic circuit, such as memory system 100, may be partitioned into individual integrated circuit dies (or "dies"), where each die may include a single copy of the electronic circuit. In some examples, at least some components (e.g., conductive traces, capacitive elements, resistive elements, transistors, drivers, and circuit logic, etc.) of a particular die of the integrated circuit may be represented by the components of memory system 100.

In some cases, characteristics of an electronic circuit on one die of an integrated circuit may vary from characteristics of an electronic circuit on another die of the integrated circuit—e.g., due to process variations and/or manufacturing defects. For example, a physical implementation of memory system 100 on one die may have different propagation delays, slew rates, and/or desired operating voltages than on another die. In some cases, operating parameters (e.g., timing, voltage levels, and/or current levels) used to operate the components of an electronic circuit on one die may be less effective or inadequate for the components of an electronic circuit on another die.

In some cases, characteristics within the dies of an integrated circuit may be adjusted (or "trimmed") for a particular die/electronic circuit so that preferred operating parameters can be used to operate the components on the particular die/electronic circuit. For example, a voltage used to access memory cells on a particular die may be modified (e.g., increased or decreased) relative to a default voltage used to access memory cells on other dies of a same integrated circuit. In another example, a timing of applied voltages or currents for accessing memory cells on the particular die may be modified relative to a default timing for applying voltages or currents to access memory cells on dies of a same or different integrated circuit—e.g., a duration between applying a first voltage and a second voltage may be increased or decreased.

To adjust the operating parameters used to operate components of a particular die/electronic circuit, information for adjusting the operating parameters (or "trimming information") may be stored in the die/electronic circuit and broadcast to relevant device(s) of the electronic circuit (e.g., on power-up). The relevant device(s) receiving the information may alter a magnitude or timing of signals applied to components (e.g., memory cells) in the die/electronic circuit based on the received information—e.g., by activating delay components or modifying an output voltage of a driver. In some cases, the trimming information may apply throughout the die and may be referred to as "global trimming information."

In some cases, a particular die/electronic circuit may be tested before operating parameters adjustments are determined for a particular die/electronic circuit. During testing, characteristics of the particular die/electronic circuit may be determined and potential adjustments to operating parameters for the die/electronic circuit may be identified accordingly. For example, the magnitude of voltages applied to certain memory cells, propagation delays, and read/write errors in memory system 100 may be observed during the testing phase and adjustments to the voltages and delays that would yield less read/write errors memory system 100 may be determined. In some cases, the preferred timing and voltage parameters may be selected so that memory cells, such as memory cell 105, are accessible within desired timing constraints and with a desired error rate. In some cases, information corresponding to operating parameter adjustments determined for a particular die may be stored in components of the electronic circuit/die, as discussed above and herein.

In some examples, during the testing phase, row lines 110, column lines 115, and/or plate lines that are defective or coupled with defective memory cells may be identified along with corresponding row, column, or plate addresses. In some cases, memory addresses corresponding to the defective access lines or memory cells (or "repair information") may be stored in components of the electronic circuit/die, as discussed above and herein. In some cases, such testing is continued throughout the life of a particular die and operating parameters may also be changed throughout the life of the die based on the results of the continued testing. In other cases, the operating parameters adjustments and repair information may be determined without performing a prior testing operation—e.g., to correct known or predicted issues.

In some cases, trimming and repair information for a die/electronic circuit may be stored in non-volatile storage elements (or "fuses"). A fuse may be or include a device that may be set to a high or low resistive state (either semi-permanently or permanently). For example, a fuse may be an analog fuse that permanently stores a high resistance state after a filament in the fuse is melted or an electronic fuse with a variable resistance that is programmable to have either a high or low resistance.

A die/electronic circuit including multiple fuses may designate certain fuses to certain types of information. For example, for an electronic circuit including components of memory system 100 and fuses, some of the fuses (or "option fuses") may be used to store trimming information that causes memory cells 105 in memory system 100 to be accessed according to particular timing and/or biasing parameters determined for the particular die. While other of the fuses (or "repair fuses") may be used to store repair information—e.g., row, column, and/or plate addresses corresponding to row lines 110, column lines 115, and/or plate lines in memory system 100 that are identified as defective or coupled with memory cells 105 in memory system 100 that are identified as defective.

In some examples, storing trimming information may include identifying (e.g., during testing) preferred timing and voltage parameters for accessing memory cells in memory system 100 and determining a corresponding trim code (e.g., "01") to store in the option fuses. In some cases, the trim code may be selected so that memory cells are accessible within desired timing constraints and with a desired error rate—e.g., by using particular timing and voltage values for accessing the memory cells. Similarly, row lines 110, column lines 115, and/or plate lines that are defective or coupled with defective memory cells may be identified and corresponding row, column, or plate addresses may be stored in repair fuses.

In some cases, a die/electronic circuit is configured so that all of the fuses in the die/electronic circuit are positioned in a fuse array—e.g., to simplify the manufacturing process. The fuse array may include one or more fuse sets, each fuse set including multiple fuses. In some cases, the number of fuses in a fuse set is determined based on a number of bits used to convey information that is to be stored in a fuse set. For example, the number of fuses included in the one or more fuse set may be greater than or equal to the largest number of bits used to convey a certain type of information to be stored in a fuse set—e.g., if 16 bits are used to convey a first type of information (such as a row address), then each fuse set may include 16 fuses. Similarly, a size of an electronic communications bus may be determined based on the number of fuses and/or the largest number of bits used to convey information stored in a fuse set—e.g., if 16 bits are used to convey a first type of information (such as a row address), then the bus may be capable of conveying 16 bits of information in parallel.

In some cases, a die/electronic may also include a fuse logic component that implements a mapping between the information stored in the fuses and particular components of the die. For example, the fuse logic component may map trimming information stored in option fuses to corresponding option latches and repair information to corresponding repair latches.

Operating information stored in fuse sets may be broadcast (e.g., serially) throughout the die (e.g., on power-up) and aspects of the die may be operated according to the operating information. Broadcasting fuse data in memory system 100 may include passing a fuse token from one memory section to another and writing relevant information to latches in a memory section where the fuse token is active. For example, for a die including components of memory system 100 and a set of fuses, a trim code stored in option fuses may be broadcast to option latches throughout the die and memory cells 105 may be accessed using timing, voltages, and or currents corresponding to the trim code. In another example, defective memory addresses may be broadcast to repair latches throughout the die. Later, memory system 100 may receive a memory address in a request to access memory cells 105. The memory address may be compared with the latched defective memory addresses and a different, redundant set of memory cells 105 may be accessed when the memory address matches a defective memory address.

The die/electronic circuit may also include multiple memory banks, each memory bank including a portion of the memory cells that are dispersed across the die/electronic circuit. In some examples, when a memory system includes multiple memory banks, all of the fuses on the die may be located in a fuse array that is centrally-located relative to the memory banks—e.g., to simplify the manufacturing process, to increase density of the memory system, or the like. In some cases, particular fuses (e.g., both option and repair fuses) and/or fuse sets in a fuse array may be mapped to and store information (e.g., repair information) for particular memory banks. In some examples, information stored in a fuse set associated with a particular memory bank may be delivered and stored at a latch that is local to the particular memory bank. In some cases—e.g., at power up—the information stored in the fuses may be broadcast to local latches throughout the memory system.

In some examples, memory system 100 includes a fuse array and multiple memory banks. As discussed herein, process variations across an integrated circuit may result in variations across different dies of the integrated circuit. Similarly, process variations may result in variations across different memory banks. In some cases, certain memory banks may meet timing, voltage, and/or reliability standards when operated using particular operating parameters, while other memory banks may not. In some examples, global trimming information used to adjust the operating parameters of all of the memory banks in a memory system may enhance the operation of some memory banks in memory system 100, while hindering or having little effect on other memory banks in memory system 100. For example, applying a global trimming code of "10" to all of the memory banks may cause all but two of the memory banks to perform within specification.

Accordingly, information for adjusting operating parameters of particular memory banks or memory bank groups (or "local trimming information") may be determined and stored, in addition to, or instead of, information for adjusting operating parameters for the full memory system—that is, in addition to global trimming information. Local trimming information may be determined based on testing, or predicted behavior, of the memory banks. For example, applying a local trimming code of "01" to the two memory banks above may bring the two memory banks within specification. Thus in such an example, all of the memory banks may be operating within specification by applying a global trimming code of "10" to most of the memory banks in the memory system and by applying a local trimming code of "01" to the other two memory banks.

In some cases, the local trimming information may be stored in additional fuse sets. For example, first local trimming information for a first memory bank or memory bank group may be stored in a first fuse set, second local trimming information for a second memory bank or memory bank group may be stored in a second fuse set, and so on.

The local trimming information may be broadcast to latches throughout memory system 100. For example, local trimming information for a first memory bank and stored in a first fuse set may be transmitted to a local trimming latch located within or proximate to the first memory bank. In some cases, broadcasting information from additional fuse sets may increase a fuse broadcasting period as each additional fuse set may be individually latched.

As discussed herein, fuse sets storing smaller data types may include unused fuses. To utilize existing fuse resources and to avoid significantly increasing a fuse broadcasting period, local trimming information may be stored in fuse sets storing smaller data types and/or containing unused fuses.

For example, memory system 100 may store information of the largest data type (e.g., a row address for a memory bank) in a first fuse set containing a first number of fuses and information of a smaller data type (e.g., a column address for the memory bank) in a second fuse set containing the same number of fuses as the first fuse set. Memory system 100 may store the information of the smaller data type in the second fuse set. After storing the information of the smaller data type, memory system 100 may identify and select unused fuses in the second fuse set to store local trimming information for the memory bank. By storing local trimming information for a memory bank in a fuse set that also stores repair information for the memory bank, memory system 100 may utilize existing resources and broadcast local trimming information to a memory bank with minor changes to the broadcasting process. That is, by utilizing the existing transmission of local repair information to a memory bank, memory system 100 may avoid performing additional transmissions of local trimming information to the memory bank. In some examples, memory system 100 may similarly store local trimming information for memory bank groups.

In some cases, local trimming may be used in combination with global trimming. For example, a global trimming setting may be determined for memory system 100 and applied to uniformly adjust the operating parameters for each memory banks. After adjusting the operating parameters, memory system 100 may identify that a performance of one or more memory banks is below a threshold and determine local trimming information for the one or more memory banks. In some cases, the memory system 100 may store local trimming information in fuse sets storing repair information for a respective memory bank, as discussed above. After storing the local trimming information, memory system 100 may provide the local trimming information to the respective memory banks, and the memory bank may use the respective local trimming information to adjust operating parameters.

In some cases, a memory bank may use the local trimming information to override a global trimming setting. For example, the memory bank may first adjust operating parameters based on a received global trimming code (e.g., "10"), and after receiving the local trimming information may apply a different local trimming code (e.g., "01"). In some cases, a memory bank generates the local trimming code based on XOR'ing the local trimming information and the global trimming information together. In such cases, if the local trimming code is "00" no changes to the global trimming will occur.

In some cases, a memory bank may use the local trimming information to add resolution to a global trimming setting.

For example, the memory bank may first adjust operating parameters based on a received global trimming code (e.g., "10"). After adjusting the operating parameters, memory system 100 may test the memory banks and determine that the performance of the memory bank is below a threshold and that additional trimming would be beneficial. The memory bank may then receive a local trimming code (e.g., "11") and apply a new trimming setting based on the combined trimming code (e.g., "1011"). In this way, the operating parameters of the memory bank may be adjusted relative to a global adjustment that is applied to each memory bank in memory system 100.

Figure 2:
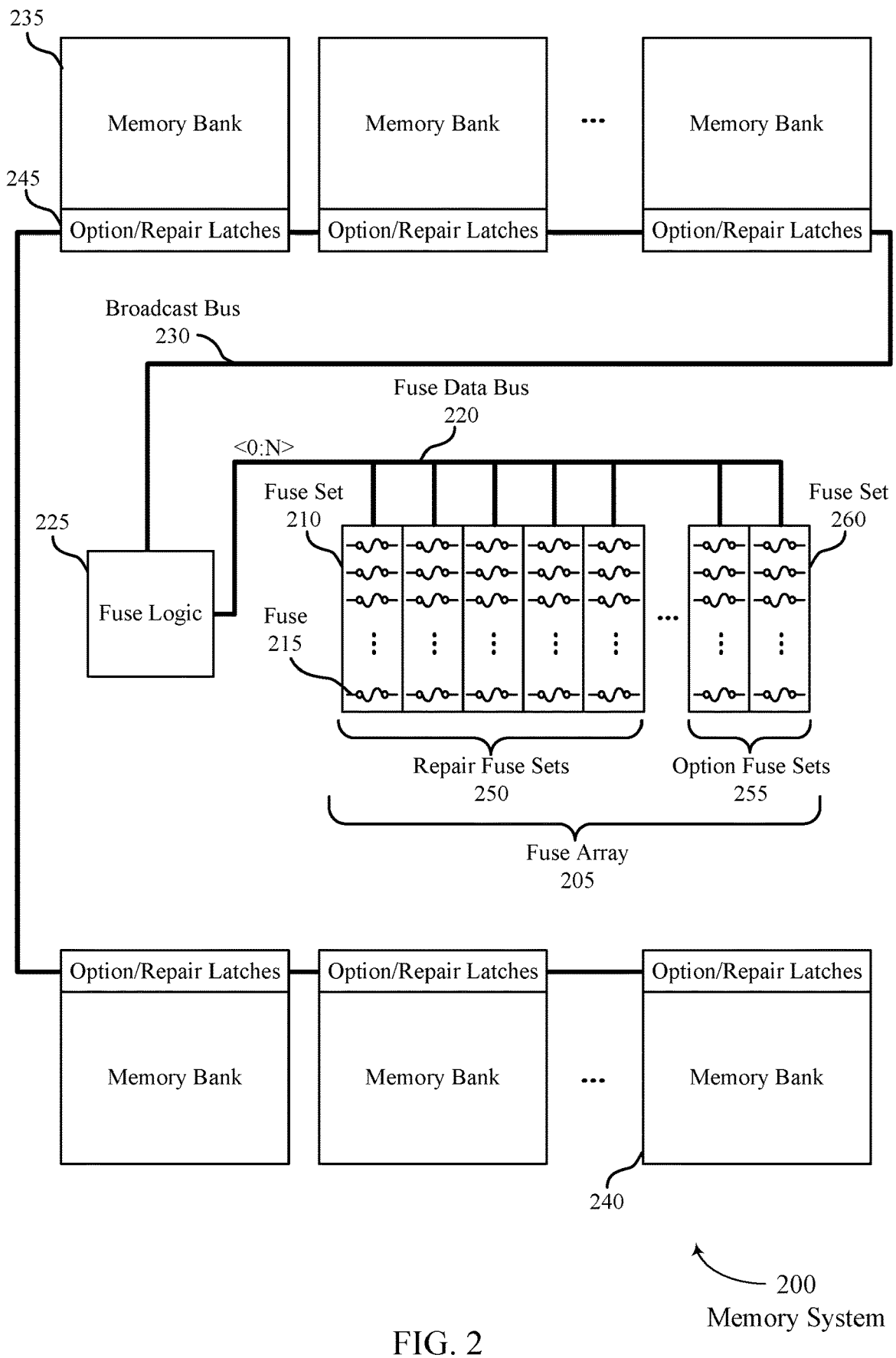
FIG. 2 illustrates aspects of an exemplary memory system that supports modifying memory bank operating parameters in accordance with various aspects of the present disclosure.

FIG. 2 illustrates aspects of an exemplary memory system that supports modifying memory bank operating parameters in accordance with various aspects of the present disclosure. Memory system 200 may be configured to store logic values and may include aspects of memory system 100 discussed in FIG. 1. Memory system 200 may include fuse array 205, fuse data bus 220, fuse logic component 225, broadcast bus 230, first memory bank 235, second memory bank 240, and latches 245.

Fuse array 205 may be configured to store operating information for memory system 200. In some cases, the operating information may include information for adjusting operating parameters of memory system 200. For example, fuse array 205 may include trimming information which may be used to adjust a timing and level of voltages or currents that are applied throughout memory system 200. Fuse array 205 may also include repair information which may be used to indicate that particular rows, columns, or plate lines are defective or associated with defective memory cells. In some cases, fuse array 205 is centrally located relative to memory banks in memory system 200.

In some cases, fuse array 205 may be partitioned into multiple fuse sets, including fuse set 210. In some examples, each fuse set may include the same number of fuses, which may be represented by N. For instance, each fuse set may include a sufficient number of fuses to support the largest type of data—e.g., if a row address is 15 bits, a column address is 6 bits, and a plate address is 13 bits, then each fuse set in fuse array 205 may include at least 15 fuses. Since the fuse sets may be configured to support the largest type of data, at times, a fuse set may have more fuses than there are data bits to be stored in the fuse set—e.g., a 14-bit column address may be stored in a fuse set containing 16 fuses. In such cases, certain fuses in a fuse set may go unused. In some cases, a fuse set storing a smaller data type may also store trimming information to fully utilize all of the fuses in a fuse set.

In some cases, fuse sets may be configured to store different types of information. For instance, the fuse sets of fuse array 205 may be configured to be repair fuse sets 250 or option fuse sets 255. Repair fuse sets 250 may store memory addresses identifying defective memory elements (e.g., column, rows, plates, and/or memory cells) in particular memory banks. Option fuse sets 255 may store global trimming information that is common to all of the memory banks. In some cases, fuse sets may store repair and/or control information for a particular memory bank or memory bank group—e.g., fuse set 210 may store a defective row, column, or plate address for first memory bank 235 and/or fuse set 210 may store a trimming code for first memory bank 235 or for a group of memory banks including first memory bank 235.

Fuse set 210 may include multiple fuses, including fuse 215. As suggested herein, the number of fuses included in fuse set 210 may be based on the largest data type to be stored in fuse array 205. Fuse 215 may be configured to store one bit of data—e.g., fuse 215 may store one bit of a 15-bit column address. In some cases, fuse 215 may be temporarily or permanently programmed to have a high resistance or low resistance, which may correspond to a logic 0 and a logic 1, respectively or vice versa. In some cases, fuse 215 is permanently programmed to have a high resistance by melting a conductive material in fuse 215 until current can no longer flow through fuse 215.

Fuse data bus 220 may be configured to uni-directionally or bi-directionally communicate the operating information to and from fuse array 205. In some cases, fuse data bus 220 is configured to support parallel signaling of the information bits stored in all of the fuses of a single fuse set and serial signaling of the data stored in each fuse set—e.g., fuse data bus 220 may concurrently signal 16 bits of information from one fuse set, concurrently signal 16 bits of information from another fuse set, and so on. To support parallel signaling of all of the information bits stored in a fuse set, a size of fuse data bus 220 may be configured to be large enough to support the largest type of data to be stored in fuse array 205. Additionally or alternatively, a size of fuse data bus 220 may be configured to be at least as large as the fuse sets in fuse array 205. In some cases, fuse data bus 220 includes multiple conductive traces, which may be represented by the number N—e.g., if fuse set 210 includes 16 fuses, then fuse data bus 220 may include 16 conductive traces. Fuse data bus 220 may communicate the information stored in fuse array 205 to fuse logic component 225.

Fuse logic component 225 may be configured to process and distribute the information stored in fuse array 205 to the appropriate locations throughout memory system 200. For example, fuse logic component 225 may access and transmit data stored in particular fuse sets to particular latches throughout memory system 200. Fuse logic component 225 may ensure that the proper information is sent to the proper latches and/or memory bank by transmitting an activation signal (or "token") that is passed throughout memory system 200 and a series of pulses that indicate when to latch data, as discussed in more detail herein and with reference to FIGS. 4A and 4B. For instance, when fuse set 210 stores repair information for first memory bank 235, fuse logic component 225 may ensure that the repair information is delivered to repair latches included in latches 245. Fuse logic component 225 may transmit the activation signal and pulses over broadcast bus 230. Similarly, when fuse set 260 stores global trimming information, fuse logic component 225 may ensure that the global trimming information is provided to each option latch in memory system 200. In some cases, the process of distributing the data stored in the fuse sets of fuse array 205 throughout memory system 200 may be referred to as broadcasting.

Broadcast bus 230 may be configured to deliver fuse data to particular latches located throughout memory system 200, along with signaling (e.g., an activation signal and clock signal) to ensure that the proper fuse data is stored in the proper latch locations.

Memory system 200 includes multiple memory banks, such as first memory bank 235 and second memory bank 240. In some cases, the memory banks in memory system 200 are grouped into memory bank groups—e.g., first memory bank 235 may be associated with a first memory bank group and second memory bank 240 may be associated with a second memory bank group. Each memory bank group may include a subset of the memory banks included in memory system 200.

First memory bank 235 may be configured to store electronic data (e.g., user data). First memory bank 235 may include multiple memory cells which may be arranged in rows and columns. The memory cells in first memory bank 235 may also be coupled with and accessible via row lines, column lines, and/or plate lines. In some cases, certain memory cells, row lines, column lines, and/or plate lines may be identified as being corrupted or defective—e.g., due to manufacturing failures, overheating, and the like. Second memory bank 240 may be similarly constructed as first memory bank 235.

Latches 245 may be configured to store information for operating first memory bank 235. In some cases, latches 245 may include repair latches and/or option latches. In some example, repair latches in latches 245 may store memory addresses corresponding to defective memory elements identified in first memory bank 235—e.g., defective row, column, plates or memory cells. Additionally or alternatively, option latches in latches 245 may store trimming codes for adjusting a timing or magnitude of voltage or currents applied to components of first memory bank 235.

As discussed herein, the characteristics of one memory bank may differ from the characteristics of another memory bank—e.g., due to process variations. As such, operating each memory bank using the same (or "global") operating parameters may result in enhanced performance of some memory banks and diminished or undesirable performance for other memory banks. In some cases, these differences may be significant enough that operating parameters that work for one memory bank will not work for another memory bank. For example, operating parameters (e.g., voltage levels and timing) used to successfully operate second memory bank 240—e.g., operating parameters that yield a desired read/write error rate for second memory bank 240—may fail to successfully operate first memory bank 235.

In some cases, tailored (or "local") operating parameters may be determined and used for single memory banks or groups of memory banks to ensure that preferred voltages, currents, and timings are used to operate each memory bank or memory bank group in a memory system. Operating individual memory banks or memory bank groups using local operating parameters may include determining preferred operating parameters for each memory bank or memory bank group and storing information for adjusting current operating parameters of each memory bank or memory bank group based on the determination.

Before adjusting local operating parameters for a memory bank or memory bank group, preferred operating parameters may be determined for each memory bank or memory bank group—e.g., during a system test. Next, information for adjusting the operating parameters of each memory bank or memory bank group to match the preferred operating parameters may be stored in the memory system—e.g., in fuse array 205.

In some examples, local trimming information for a single memory bank or single memory bank group may be stored in repair fuse sets 250 associated with the single memory bank or single memory bank group. For instance, fuse set 210 may store repair information for first memory bank 235 and local trimming information for first memory bank 235. In another instance, fuse set 210 may store repair information for first memory bank 235 and local trimming information for a memory bank group including first memory bank 235. By storing local trimming information for a particular memory bank or memory bank group in a fuse set configured to store repair information for the memory bank or a memory bank in the memory bank group, a memory system may refrain from adding additional fuse sets to fuse array 205. Also, by storing local trimming information in this way, a memory system may facilitate delivery of the local trimming information to local latches of the particular memory bank or memory bank group. Storing information in fuse sets is discussed in more detail herein and with reference to FIG. 3.

When individually adjusting operating parameters for single memory banks or single memory bank groups, fuse logic component 225 may be used to broadcast the operating information (e.g., the global trimming, repair, and local trimming information) to the appropriate option and repair latches throughout memory system 200. Broadcasting operating information to, and storing the operating information in, latches is discussed with more detail herein and with reference to FIGS. 4A and 4B.

After the operating information has been stored in the appropriate latches, the operating information may be used to adjust operating parameters of the memory banks in memory system 200 and/or identify defective memory elements in particular memory banks. For example, a trimming code may be sent to circuitry that introduces a delay or modifies a magnitude of voltages applied within a memory bank. In another example, a memory bank may signal if a memory address received from another device matches any memory addresses that have been identified as defective in a memory bank. Adjusting operating parameters and identifying requests to access defective memory address is discussed in more detail herein.

Figure 3:
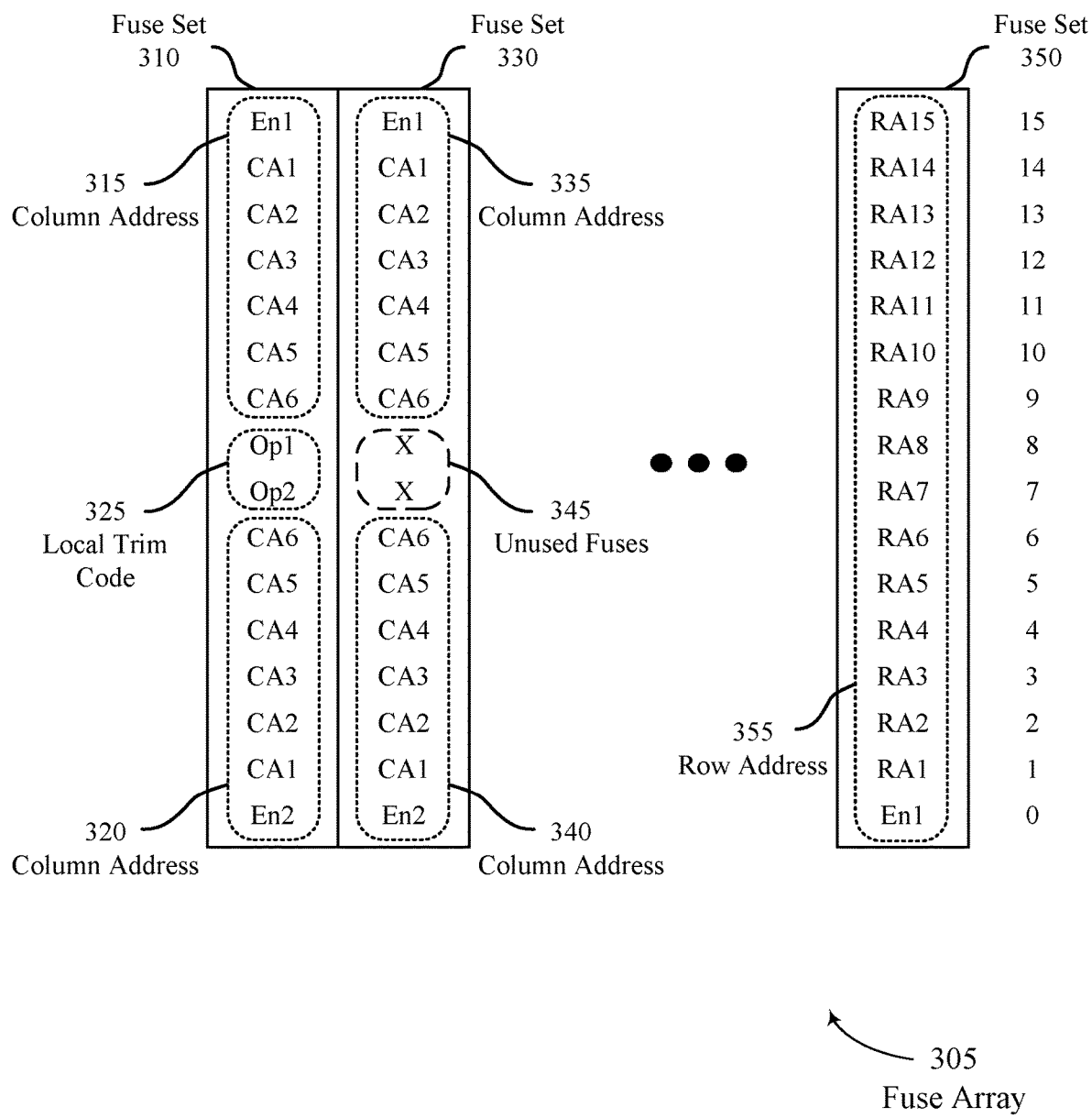
FIG. 3 illustrates aspects of an exemplary fuse array for modifying memory bank operating parameters in accordance with various aspects of the present disclosure.

FIG. 3 illustrates aspects of an exemplary fuse array that supports modifying memory bank operating parameters in accordance with various aspects of the present disclosure. Fuse array 305 may be configured to store repair and trimming information for multiple memory banks. Fuse array 305 may be an example of fuse array 205 discussed in FIG. 2.

Fuse array 305 may include multiple fuse sets including first fuse set 310, second fuse set 330, and third fuse set 350. Each of the fuse sets in fuse array 305 may include 16 fuses, numbered from 0 to 15. In some cases, each of the fuse sets include 16 fuses based on determining that the most bits used for conveying a data type to be stored in fuse array 305 is 16 bits—e.g., after determining that 15 information bits and one enable bit is used to convey a row address. Data types to be stored in fuse array 305 may include global trimming codes, local trimming codes, column repair addresses, plate repair addresses, and/or row repair addresses.

First fuse set 310 may be associated with a particular memory bank or set of memory banks and configured to store multiple column addresses—e.g., first column address 315 and second column address 320—and a trim code—e.g., local trim code 325. First fuse set 310 may include 16 fuses, seven of which may be dedicated to first column address 315, another seven of which may be dedicated to second column address 320, and two of which may be dedicated to local trim code 325. First column address 315 may be associated with a defective column of memory cell in the particular memory bank. Similarly, second column address 320 may be associated with another defective column of memory cell in the particular memory bank. And local trim code 325 may be used to adjust operating parameters of the particular memory bank.

Second fuse set 330 may be associated with a same or different memory bank or set of memory banks than first fuse set 310 and may be similarly configured to store multiple column addresses, e.g., third column address 335 and fourth column address 340. Third column address 335 and fourth column address 340 may be associated with defective memory cell columns in the associated memory bank. Second fuse set 330 may also include unused fuses 345 because the second fuse set includes 16 fuses while 14 bits are used to convey third column address 335 and fourth column address 340. In some cases, unused fuses 345 may be programmed to store a local trimming code, similar to first fuse set 310.

Third fuse set 350 may be associated with a same or different memory bank or set of memory banks than first fuse set 310 and/or second fuse set 330 and may be configured to store a row address, e.g., row address 355. Since the number of bits used to convey row address 355 is equal to the number of fuses included in third fuse set 350, third fuse set 350 may not include any unused fuses or trimming codes.

Fuse array 305 may include additional fuse sets storing the same and different types of information. For example, fuse array 305 may include one or more fuse sets storing a global trimming code for adjusting operating parameters for each memory bank that is coupled with fuse array 305. Fuse array 305 may also include one or more fuse sets storing one or more plate addresses. In some cases, the fuse sets storing the one or more plate addresses may also include unused fuses which may be left unused or used to store local trimming information.

As discussed herein, per memory bank and/or memory bank group trimming may enhance the overall operation of a memory system—e.g., by using preferable operating parameters for each memory bank or memory bank group individually. As also discussed herein, fuse arrays, such as fuse array 305, may be used to store information for adjusting operating parameters of particular memory banks or memory bank groups in the memory system. And as discussed herein, because fuse sets in fuse array 305 may be sized according to the largest data type, certain fuses in fuse sets storing smaller data types (e.g., first fuse set 310 and second fuse set 330) may include unused fuses.

In some cases, to utilize existing resources, information for adjusting operating parameters of particular memory banks or memory bank groups may be stored in unused fuses of a fuse set.

For example, local trimming information for a single memory bank may be stored in a fuse set that is also configured to store repair information (e.g., a memory address of a defective row, column, or plate) for the single memory bank. For instance, first fuse set 310 may store the addresses of two defective columns—e.g., first column address 315 and second column address 320—in a first memory bank and may also store information for adjusting operating parameters—e.g., local trimming code 325—for the first memory bank. By storing a local trimming code for a particular memory bank in a fuse set that is also configured to store repair information for the particular memory bank, a memory system may both efficiently utilize existing resources and facilitate delivery of local trimming information to a particular memory bank, as will be discussed in more detail herein and with reference to FIGS. 4A and 4B. Similarly, local trimming information for a single memory bank group may be stored in a fuse set that is also configured to store repair information (e.g., a memory address of a defective row, column, or plate) for a memory bank included in the single memory bank group.

In an example for storing information in fuse array 305, a memory system may store row address 355 in third fuse set 350, where a number of fuses included in third fuse set 350 may be equivalent to a number of bits used to convey row address 355. The memory system may also identify first fuse set 310, where first fuse set 310 may include the same number of fuses as third fuse set 350.

After identifying first fuse set 310, the memory system may select a first subset of the fuses—e.g., fuse 0 to fuse 6 and fuse 9 to fuse 16—in first fuse set 310 for conveying column repair information and a second subset of the fuses—e.g., fuses 8 and 9—for conveying local trimming information for a memory bank or memory bank group. In some cases, the first fuse set 310 is selected to store the local trimming information after the memory system determines that the number of fuses in first fuse set 310 exceeds the total number of bits used to convey first column address 315 and second column address 320.

In some cases, the fuse sets in fuse array 305 may be mapped to latches in a memory system. For instance, the first subset of fuses may be mapped to a first set of latches within a memory bank and the second subset of fuses may be mapped to a second set of latches within the memory bank. In some examples, the mapping occurs before the first and second subset of fuses are selected by the memory system.

The information in fuse array 305 may then be broadcast to and stored in respective latches throughout the memory system based on the mapping. For instance, after broadcasting is completed, the first set of latches may store first column address 315 and second column address 320 and the second set of latches may store local trim code 325. Similarly, the row address 355 may be broadcasted to and stored in a third set of latches. In some examples, all of the global trimming information in fuse array 305 is broadcast during a first period, all of the row addresses in fuse array 305 are broadcast during a second period, and all of the column addresses and local trimming information in fuse array 305 are broadcast during a third period.

After the local trimming information has been broadcast and stored in the second set of latches of the memory bank, operating parameters for the memory bank may be adjusted based on the local trimming information.

Figure 4A:
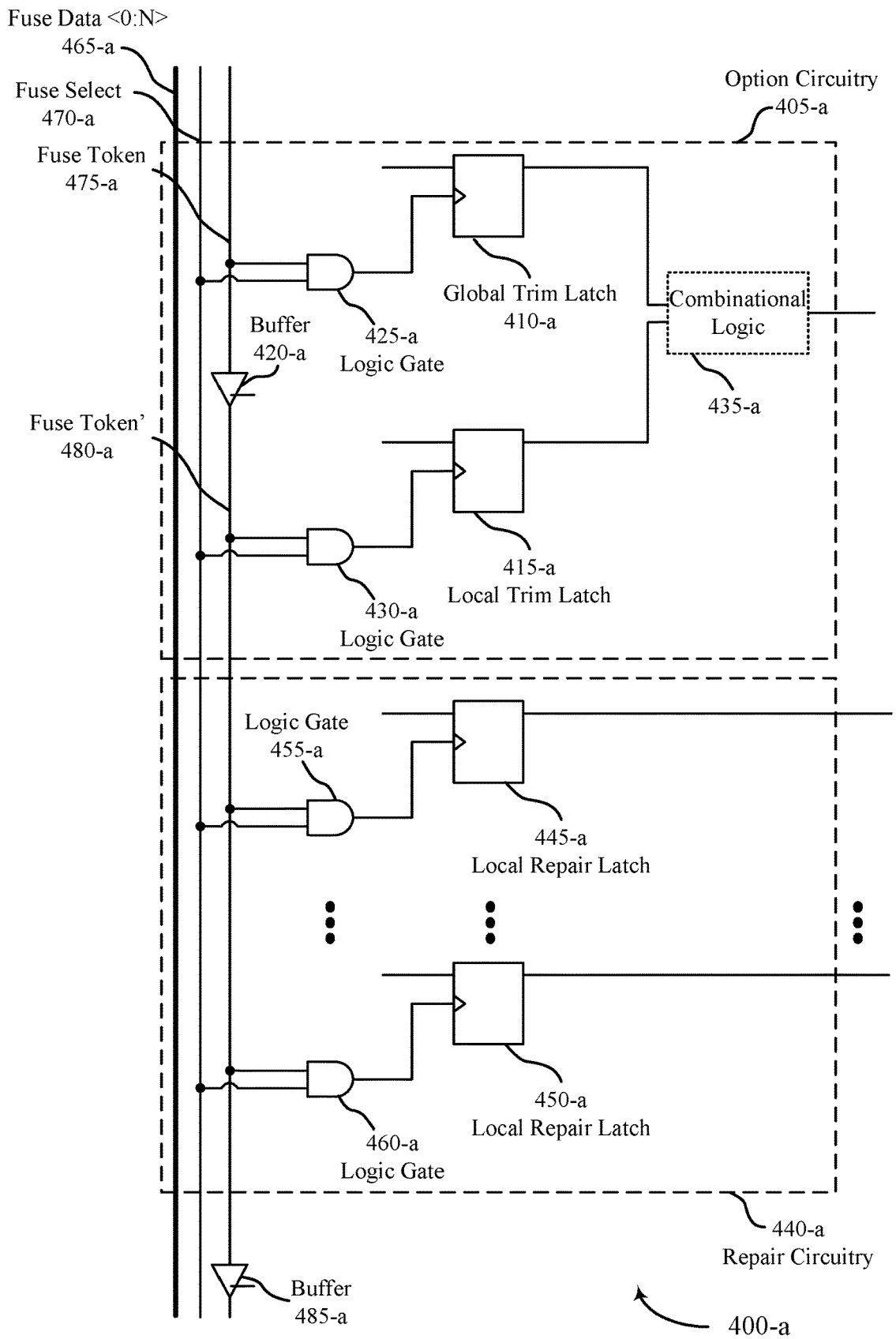
FIG. 4A illustrates aspects of an exemplary memory bank for modifying memory bank operating parameters in accordance with various aspects of the present disclosure.

FIG. 4A illustrates aspects of an exemplary memory bank that supports modifying memory bank operating parameters in accordance with various aspects of the present disclosure. An exemplary configuration of option and repair circuitry included in a memory bank is depicted in FIG. 4A.

Memory bank 400-a may be configured to store electronic data, and may be an example of first memory bank 235 or second memory bank 240 discussed in FIG. 2. Memory bank 400-a may be one of multiple memory banks included in a memory system and may be coupled with a fuse array. In some cases, memory bank 400-a may be coupled with a first fuse set (e.g., fuse set 210 of FIG. 2) configured to convey first information (e.g., global trimming information) for adjusting an access parameter of multiple or all memory banks included in a memory system. Memory bank 400-a may also be coupled with a second fuse set (e.g., fuse set 260 of FIG. 2) configured to convey second information (e.g., local trimming information) for adjusting the access parameter of memory bank 400-a or of a group of memory banks including memory bank 400-a.

Memory bank 400-a may include option circuitry 405-a, repair circuitry 440-a, fuse data bus 465-a, fuse select line 470-a, first fuse token line 475-a, second fuse token line 480-a, and buffer 485-a.

Option circuitry 405-a may be configured to process and store trimming information received from a fuse array. Option circuitry 405-a may include global trimming latch 410-*a*, local trimming latch 415-*a*, buffer 420-*a*, first logic gate 425-*a*, second logic gate 430-*a*, and combinational logic 435-*a*.

Global trimming latch 410-*a* may be configured to store a bit of a global trimming code. In some cases, global trimming latch 410-*a* is a D flip flop. In some examples, a bit of data (e.g., a global trimming code) may be applied to the input of global trimming latch 410-*a* and a voltage corresponding to the bit of data may be output by global trimming latch 410-*a* after receiving a clocking signal from first logic gate 425-*a*. In some cases, option circuitry 405-*a* includes multiple global trimming latches—e.g., the number of global trimming latches may correspond to the number of bits used to convey a global trimming code. In some cases, global trimming latch 410-*a* is coupled with and receives global trimming information from a fuse set storing global trimming information for each memory bank in a memory system.

Local trimming latch 415-*a* may be configured to store a bit of a local trimming code. In some cases, local trimming latch 415-*a* is a D flip flop. In some examples, a bit of data (e.g., a local trimming code) may be applied to the input of local trimming latch 415-*a* and a voltage corresponding to the bit of data may be output by local trimming latch 415-*a* after receiving a clocking signal from second logic gate 430-*a*. In some cases, option circuitry 405-*a* includes multiple local trimming latches—e.g., the number of global trimming latches may correspond to the number of bits used to convey a local trimming code. In some cases, local trimming latch 415-*a* is coupled with and receives local trimming information from a fuse set storing local trimming information for memory bank 400-*a*.

In some cases, option circuitry 405-*a* includes multiple global trimming latches and multiple local trimming latches to support larger trimming codes (e.g., 14-bit trimming codes). In some cases, a larger local trimming code is stored across multiple fuse sets and serially stored in the local trimming latches.

Buffer 420-*a* may be used to pass a fuse token from one section of memory bank 400-*a* to another. Buffer 420-*a* may be a tri-state buffer or latch. In some cases, buffer 420-*a* outputs a high voltage when first fuse token line 475-*a* is high after an activation signal is received. Buffer 420-*a* may continue to hold the high voltage even after the first fuse token line 475-*a* is low.

First logic gate 425-*a* may be used to apply a clocking signal to global trimming latch 410-*a*. In some cases, first logic gate 425-*a* is an AND gate. First logic gate 425-*a* may output a high voltage when first fuse token line 475-*a* and fuse select line 470-*a* are high.

Second logic gate 430-*a* may be used to apply a clocking signal to local trimming latch 415-*a*. In some cases, second logic gate 430-*a* is an AND gate. Second logic gate 430-*a* may output a high voltage when second fuse token line 480-*a* and fuse select line 470-*a* are high.

Combinational logic 435-*a* may be configured to receive the output of global trimming latch and local trimming latch to generate a local trimming code for memory bank 400-*a* based on a global trimming code stored in global trimming latch 410-*a* and a local trimming code stored in local trimming latch 415-*a*. In some cases, combinational logic 435-*a* is an XOR gate. In other cases, combinational logic 435-*a* combines the global trimming code and the local trimming code to create a larger trimming code that may be used to more finely adjust operating parameters of memory bank 400-*a*.

In some cases, combinational logic 435-*a* may not be included in memory bank 400-*a* and a global trimming code and local trimming code may be independently applied to memory bank 400-*a*. By independently applying a global and local trimming code for memory bank 400-*a*, operating parameters of memory bank 400-*a* may be adjusted relative to global adjustments of the operating parameters. Also, independently applying a global and local trimming code may allow for finer adjustment of the operating parameters of memory bank 400-*a*—e.g., the operating parameters may be increase with higher resolution.

Repair circuitry 440-*a* may be configured to process and store defective memory addresses (e.g., row, column, or plate addresses) identified in memory bank 400-*a*. Repair circuitry 440-*a* may include first local repair latch 445-*a* to nth local repair latch 450-*a*, third logic gate 455-*a*, and nth logic gate 460-*a*.

First local repair latch 445-*a* may be configured to store a bit of a defective memory address. In some cases, first local repair latch 445-*a* is a D flip flop. In some examples, a bit of data (e.g., a defective memory address) may be applied to the input of first local repair latch 445-*a* and a voltage corresponding to the bit of data may be output by first local repair latch 445-*a* after receiving a clocking signal from third logic gate 455-*a*.

Nth local repair latch 450-*a* may be configured to store a bit of a defective memory address. In some cases, nth local repair latch 450-*a* is a D flip flop. In some examples, a bit of data (e.g., a defective memory address) may be applied to the input of nth local repair latch 450-*a* and a voltage corresponding to the bit of data may be output by nth local repair latch 450-*a* after receiving a clocking signal from nth logic gate 460-*a*. In some examples, nth local repair latch 450-*a* is the 16th local repair latch included in repair circuitry 440-*a*. In some cases, one or more local repair latches included in repair circuitry 440-*a* will go unused (e.g., when less than 16 bits is used to convey the applied fuse data). In some cases, first local repair latch 445-*a* to nth local repair latch 450-*a* together may be configured to store information indicating a defective memory address in memory bank 400-*a*.

Third logic gate 455-*a* and nth logic gate 460-*a* may be similarly configured to first logic gate 425-*a* and second logic gate 430-*a* and may be used to apply clocking signals to first local repair latch 445-*a* and nth local repair latch 450-*a*.

Fuse data bus 465-*a* may be configured to carry data from fuses to local latches such as global trimming latch 410-*a*, local trimming latch 415-*a*, and first local repair latch 445-*a*. In some cases, fuse data bus 465-*a* includes N conductive traces, where N is equal to the number of fuses included in the fuse sets of a fuse array.

Fuse select line 470-*a* may be configured to carry a signal for clocking the latches in memory bank 400-*a*. For example, a voltage pulse may be transmitted over fuse select line 470-*a* with a certain periodicity.

First fuse token line 475-*a* may be configured to carry and pass a token from one section of memory bank 400-*a* to another section. In some cases, first fuse token line 475-*a* may be coupled with each memory bank in a memory system. Second fuse token line 480-*a* may also be configured to carry and pass a token from one section of memory bank 400-*a* to another section. In some cases, the token may be passed from first fuse token line 475-*a* to second fuse token line 480-*a*. The token, in combination with the clocking signal on fuse select line 470-*a*, may be used to ensure that latches in only one section of memory bank 400-*a* are written at a time. In some cases, fuse data bus 465-*a*, fuse select line 470-*a*, first fuse token line 475-*a* and second fuse token line 480-*a* may be included in a broadcast bus, such as broadcast bus 230 of FIG. 2.

In some examples, a fuse logic component, such as fuse logic component 225 of FIG. 2, may map certain fuse sets to certain latches in memory bank 400-*a*. Fuse logic component 225 may also control the transmission of control and data signals over fuse data bus 465-*a*, fuse select line 470-*a*, first fuse token line 475-*a*, and second fuse token line 480-*a* to ensure the correct fuse data is written to the correct latch, in what may be referred to as broadcasting. For example, fuse logic component may transmit local trimming information to be stored in local trimming latch 415-*a* and repair information to be stored in local repair latches 445-*a* to 450-*a* when second fuse token line 480-*a* is high. Broadcasting fuse data stored in a fuse array is discussed in more detail herein and with respect to FIG. 4B.

Buffer 485-*a* may be configured to pass the token from second fuse token line 480-*a* to a next fuse token line and a next set of latches. Buffer 485-*a* may be a tri-state buffer or a latch.

In some cases, option circuitry 405-*a* and repair circuitry 440-*a* are coupled with additional circuitry in memory bank 400-*a*. For example, memory bank 400-*a* may include a trimming component configured to modify an access parameter of memory bank 400-*a*. In some cases, the trimming component may be coupled with an output of combinational logic 435-*a*. In some cases, the trimming component may be separately coupled with an output of global trimming latch 410-*a* and an output of local trimming latch 415-*a*. In some cases, trimming component may include a timing or delay component configured to introduce delay a signal transmitted within memory bank 400-*a*. The trimming component may also include a biasing component configured to modify a voltage or current of signals applied within memory bank 400-*a*. In some instances, the biasing component may be used to adjust an output of an operational amplifier, or driver, used to apply a voltage or current to a plate, word, or digit line of memory bank 400-*a*—e.g., the biasing component may reduce or increase the maximum output voltage of a driver.

In another example, memory bank 400-*a* may include a memory address compare component configured to compare a value of a requested memory address with a value of a defective memory address in memory bank 400-*a*. In some cases, the memory address compare component may be coupled with the outputs of local repair latches 445-*a* to 450-*a*.

Figure 4B:
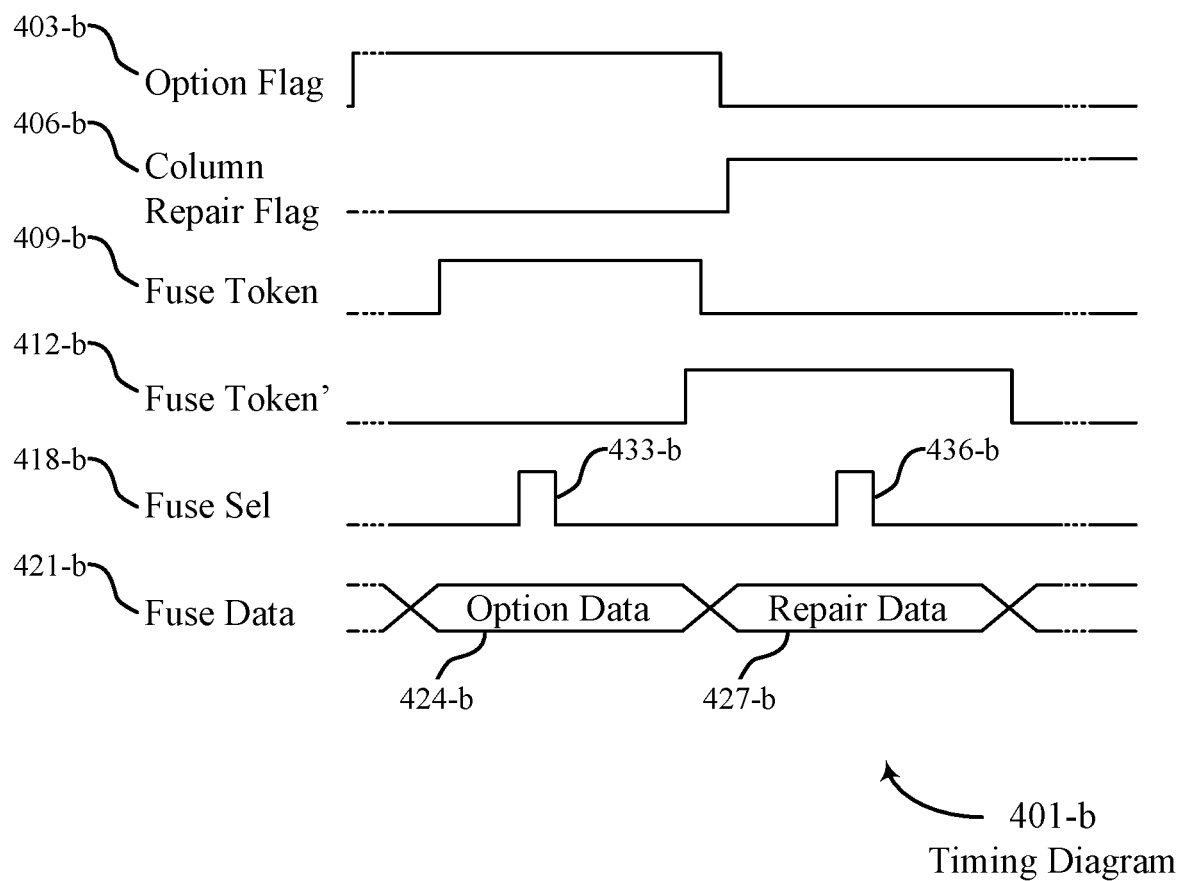
FIG. 4B illustrates an exemplary timing diagram for modifying memory bank operating parameters in accordance with various aspects of the present disclosure.

FIG. 4B illustrates an exemplary timing diagram for modifying memory bank operating parameters in accordance with various aspects of the present disclosure. Timing diagram 401-*b* may depict exemplary signals used to operate aspects of memory bank 400-*a* of FIG. 4A. In some cases, a fuse logic component, such as fuse logic component 225, may be configured to transmit the signaling depicted in FIG. 4B Option flag 403-*b* may be configured to indicate when data stored in option fuses is being broadcasted throughout a memory system. Column repair flag 406-*b* may be configured to indicate when data stored in column repair fuses is being broadcasted throughout a memory system. First fuse token 409-*b* may be representative of a voltage of first fuse token line 475-*a*. Second fuse token 412-*b* may be representative of a voltage of second fuse token line 480-*a*. Fuse selection signal 418-*b* may be representative of a voltage of fuse select line 470-*a*. Fuse data 421-*b* may be representative of an N-bit word sent over fuse data bus 465-*a*.

As discussed herein, a memory system may store information for adjusting one or more operating parameters of memory bank 400-*a* (e.g., local trimming information) in a fuse set that is coupled with memory bank 400-*a*. For instance, the memory system may store the information in the fuse set after determining that one or more operating parameters of memory bank 400-*a* is below a threshold. Additionally or alternatively, the memory system may store the information in the fuse set based on historical information—e.g., based on known or predictable manufacturing process defects. The memory system may also store information for adjusting one or more operating parameters for multiple memory banks (e.g., global trimming information), including memory bank 400-*a*, in another fuse set that is coupled with memory bank 400-*a*. Additionally, the memory system may store information indicating a defective memory address of memory bank 400-*a* in a fuse set. In some cases, the information indicating the defective memory address and the information for adjusting the one or more operating parameters of memory bank 400-*a* (e.g., repair information) may be stored in a same fuse set.

The information stored in the fuse sets may be broadcast throughout memory system. In some cases, the information is broadcast from fuses in a particular order—e.g., data stored in fuse sets storing trimming information may be transmitted first, then data stored in fuse sets storing column repair information may be transmitted, then data stored in fuse sets storing row repair information may be transmitted, and then data stored in fuse sets storing plate repair information may be transmitted (other orders may be used).

In some examples of broadcasting fuse data, global trimming information stored in option fuses is transmitted throughout a memory system. During transmission of global trimming information, option flag 403-*b* and first fuse token 409-*b* may be high. In some cases, first fuse token 409-*b* may be simultaneously delivered to each memory bank in a memory system via first fuse token line 475-*a*. Additionally, option data 424-*b* (e.g., a global trimming code) may be present on fuse data bus 465-*a*.

Bits of option data 424-*b* may be mapped to particular latches in memory bank 400-*a*. For example, a first bit of option data 424-*b* may be delivered to an input of global trimming latch 410-*a*. The first bit of option data 424-*b* may be similarly delivered to an input of global trimming latches located at each memory bank in a memory system. Or global trimming latch 410-*a* may be common to all of the memory banks in the memory system.

While first fuse token 409-*b* remains high, a first pulse 433-*b* may be transmitted over fuse select line 470-*a*. When both fuse selection signal 418-*b* and first fuse token 409-*b* are high, an output of first logic gate 425-*a* may transition from a low voltage to a high voltage. The transition of the output of first logic gate 425-*a* may clock global trimming latch 410-*a* causing global trimming latch 410-*a* to store the first bit of option data 424-*b* located at the input of global trimming latch 410-*a*.

Next, column repair information may be transmitted throughout the memory system. In some cases, during transmission of the column repair information, column repair flag may be high. To write information to the next section of memory bank 400-*a*, the fuse token may be passed from one section of memory bank 400-*a* to the next. Accordingly, first fuse token 409-*b* may return to a low voltage and second fuse token 412-*b* may be high. In some cases, second fuse token 412-*b* may transition to a high voltage based on first fuse token 409-*b* being applied to buffer 420-*a* and a clocking signal being delivered to buffer 420-*a*. Additionally, column repair data 427-*b* may be transmitted over fuse data bus 465-*a*. As discussed herein, column repair data 427-*b* may also include local trimming information.

Bits of column repair data 427-*b* may be mapped to particular latches in memory bank 400-*a*. For example, a first bit of column repair data 427-*b* corresponding to a bit of local trimming information may be delivered to an input of local trimming latch 415-*a*. And bits of column repair data 427 corresponding to one or more defective column addresses may be delivered to inputs of local repair latches 445-*a* to 450-*a*.

While second fuse token 412-*b* remains high, a second pulse 436-*b* may be transmitted over fuse select line 470-*a*. When both fuse selection signal 418-*b* and second fuse token 412-*b* are high, an output of second logic gate 430-*a* and outputs of third logic gate 455-*a* to nth logic gate 460-*a* may transition from a low voltage to a high voltage. The transition of the output of second logic gate 430-*a* may clock local trimming latch 415-*a* causing local trimming latch 415-*a* to store a first bit of local trimming information located at the input of local trimming latch 415-*a*. The transition of the outputs of logic gates 455-*a* to 460-*a* may clock local repair latches 445-*a* to 450-*a* causing all local repair latches 445-*a* to 450-*a* respective bits of a defective column address. After column repair data 427-*b* is written to local trimming latch 415-*a* and local repair latches 445-*a* to 450-*a*, the token may be passed to a next section of memory bank 400-*a* by way of buffer 485-*a* and additional repair information may be written to additional latches in the next section of memory bank 400-*a*, and so on.

After the global trimming information, local trimming information, and repair information has been stored in global trimming latch 410-*a*, local trimming latch 415-*a*, and local repair latches 445-*a* to 450-*a*, the information may be used to adjust one or more operating parameters of memory bank 400-*a*.

In some examples, the global trimming information (e.g., a global trimming code) stored in global trimming latch 410-*a* may be provided directly to trimming circuitry in memory bank 400-*a*. And the trimming circuitry may adjust timing and/or biasing parameters for memory bank 400-*a* based on the received global trimming information. In some cases, after providing the global trimming information, the local trimming information (e.g., a local trimming code) stored in local trimming latch 415-*a* may be provided to the trimming circuitry. And the trimming circuitry may adjust the timing and/or biasing parameters based on the received local trimming information. In some cases, the trimming circuitry may use the local trimming information to adjust the timing and/or biasing parameters relative to the adjustment made based on the global trimming information. In this way, the local trimming parameters may allow for finer adjustment of local operating parameters. In some cases, a value for the local trimming information is determined after adjusting using the global trimming information to adjust the operating parameters for memory bank 400-*a*.

In some examples, the global trimming information stored in global trimming latch 410-*a* and the local trimming information stored in local trimming latch 415-*a* may be provided to combinational logic 435-*a*. And combinational logic 435-*a* may generate a local trimming code for memory bank 400-*a* based on the global trimming information and the local trimming information. For example, combinational logic 435-*a* may compare the global trimming information and the local trimming information. In some cases, combinational logic 435-*a* may generate a local trimming code by XOR'ing the global trimming information and the local trimming information. Combinational logic 435-*a* may transmit an output of the comparison to trimming circuitry in memory bank 400-*a*. And in some examples, a timing component in the trimming circuitry may modify a timing of a memory operations performed on memory bank 400-*a*. Additionally or alternatively, a biasing component in the trimming circuitry may modify a magnitude of one or more voltages or currents applied within memory bank 400-*a*— e.g., may increase or decrease the magnitude of the voltages or currents.

In some examples combinational logic 435-*a* may pass the local trimming information through to trimming circuitry in memory bank 400-*a* and may ignore the global trimming information. In this way, each memory bank may be individually adjusted without performing global trimming.

As discussed herein, in some cases, the local trimming information stored in local trimming latch 415-*a* and/or the output of combinational logic 435-*a* may be used to adjust operating parameters for a memory bank group including memory bank 400-*a*.

In some examples, the repair information (e.g., one or more column addresses) stored in local repair latches 445-*a* to 450-*a* may be provided to a memory address compare component. In some cases, outputs of certain local repair latches 445-*a* to 450-*a* may be ignored or left unused. For example, an output of local repair latches of local repair latches 445-*a* to 450-*a* that receive a bit of fuse data corresponding to a local trimming code or an unused fused may be ignored.

As discussed herein, a fuse logic component, such as fuse logic component 225, may be configured to ensure that the correct fuse data is transmitted to the correct latches. That is, the fuse logic component may cause the fuse token to be passed from one section of a memory bank to another section and may broadcast fuse data for a section when the fuse token is active in that section.

Figure 5:
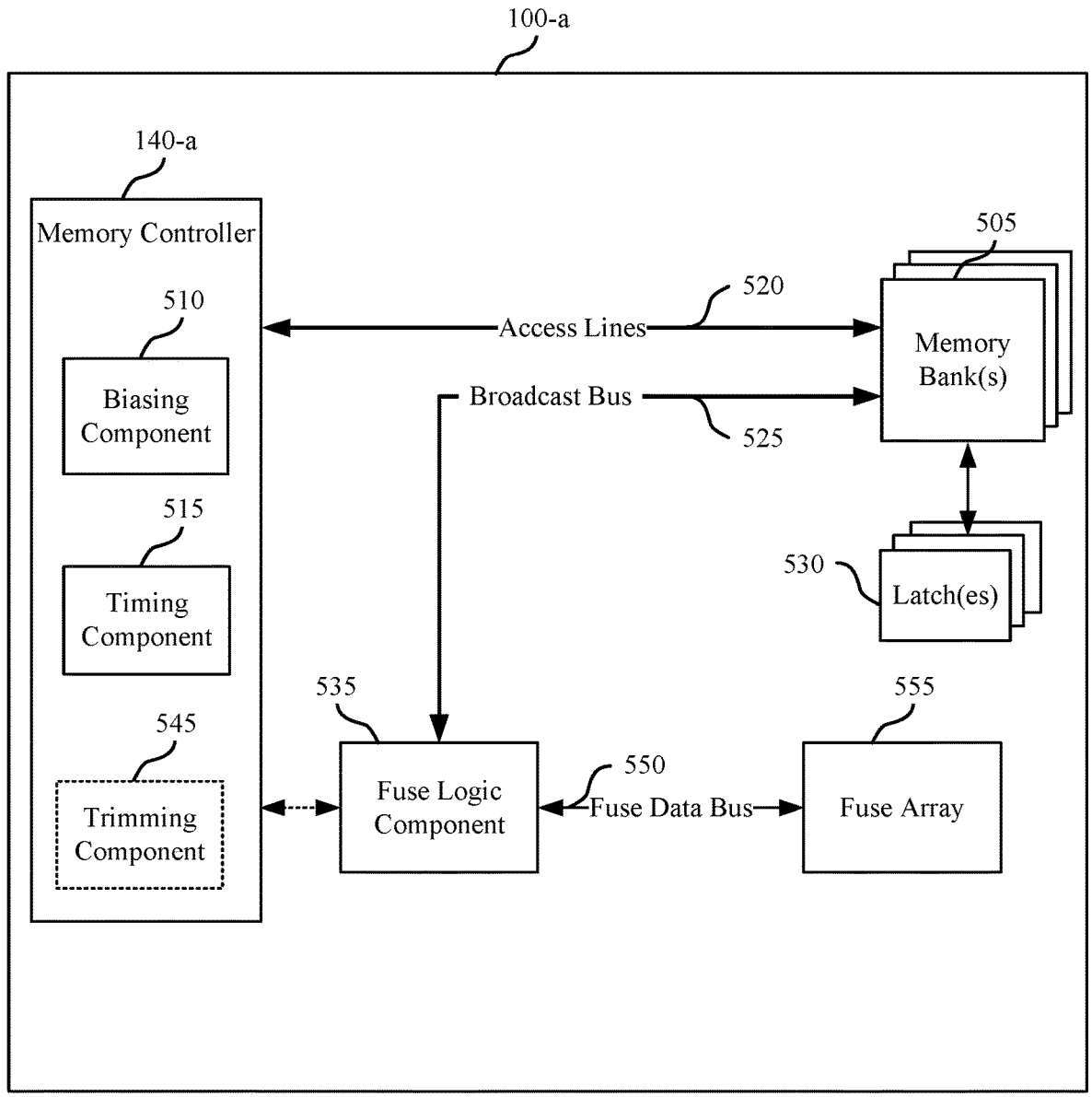
FIG. 5 illustrates a block diagram of an example memory system that supports modifying memory bank operating parameters in accordance with various embodiments of the present disclosure.

FIG. 5 illustrates a block diagram of an example memory system that supports modifying memory bank operating parameters in accordance with various embodiments of the present disclosure. Memory system 100-*a* may be referred to as an electronic memory apparatus and includes memory controller 140-*a*, which may be an example of memory controller 140 described with reference to FIG. 1. Memory system 100-*a* may also include access lines 520, broadcast bus 525, latches 530, fuse logic component 535, fuse data bus 550, and fuse array 555. The components of memory system 100-*a* may be in electronic communication with each other and may perform the functions described with reference to FIGS. 1-4B.

Memory controller 140-*a* may, in combination with other components apply voltages throughout memory system 100-*a*, write data to memory banks 505, read data from memory banks 505, and generally operate memory system 100-*a* as described in FIGS. 1-4B. Memory controller 140-*a* may include biasing component 510 and timing component 515. In some cases, memory controller may include trimming component 545. In some cases, fuse logic component 535 may be included in memory controller 140-*a*. Memory controller 140-*a* may be in electronic communication with access lines 520, latches 530, fuse logic component 535, and fuse array 555.

Memory controller 140-*a* may be configured to access memory bank via access lines 520. For example, biasing component 510 and timing component 515 may be configured to apply a series of voltage to access lines 520 to read or write memory cells in memory banks 505, as described herein. In some cases, memory controller 140-*a* may include a row decoder, column decoder, or both, as described with reference to FIG. 1. This may enable memory controller 140-*a* to access one or more memory cells 105 in memory banks 505.

In some cases, memory controller 140-*a* may perform its operations using timing component 515. For example, timing component 515 may control the timing of the various word line selections or plate biasing, including timing for switching and voltage application to perform the memory functions, such as reading and writing, discussed herein. In some cases, timing component 515 may control the operations of biasing component 510.

Access lines 520 may include word lines, bit lines, and/or plate lines as discussed with reference to FIG. 1. Memory banks 505, broadcast bus 525, latches 530, fuse logic component 535, fuse data bus 550, and fuse array 555 may be examples of aspects of memory banks, broadcast bus 230, latches 245, fuse logic component 225, fuse data bus 220, and fuse array 205, respectively, as discussed with reference to FIG. 2.

Trimming component 545 may be configured to facilitate the modifying of operating parameters for a particular memory bank or memory bank group. For instance, trimming component may be configured to determine an operating parameter adjustment for a memory bank in memory banks 505. In some cases, trimming component may determine a global and/or local trimming codes for memory banks 505. Trimming component may be configured to operated aspects of fuse logic component 535.

In some cases, memory controller 140-*a* may determine that an operating parameter or performance of a memory bank of memory banks 505 is below a threshold. Memory controller 140-*a* may also store in a first fuse set of fuse array 555, first information (e.g., local trimming information) for adjusting the operating parameter of the memory bank. Memory controller 140-*a* may also adjust the operating parameters of the memory bank based on the first information. In some cases, memory controller may adjust the operating parameters of all or multiple of memory banks 505, including the memory bank, based on second information (e.g., global trimming information) stored in a second fuse set in fuse array 555.

In some cases, memory controller 140-*a* may store first information in a first fuse set in fuse array 555, where the first fuse set may include enough fuses to accommodate all of the bits used to convey the first information—the first information may be configured according to the largest data type stored in fuse array 555. Memory controller 140-*a* may also identify a second fuse set in fuse array 555 that includes the same number of fuses as the first fuse set. Memory controller 140-*a* may select a first subset of the fuses in the second fuse set to convey second information of a smaller data type than the first information and a second subset of the fuses in the second fuse set to convey third information (e.g., local trimming information) related to adjusting an operating parameter of a memory bank of memory banks 505. Memory controller 140-*a* may store the second information and the third information in the second fuse set.

Figure 6:
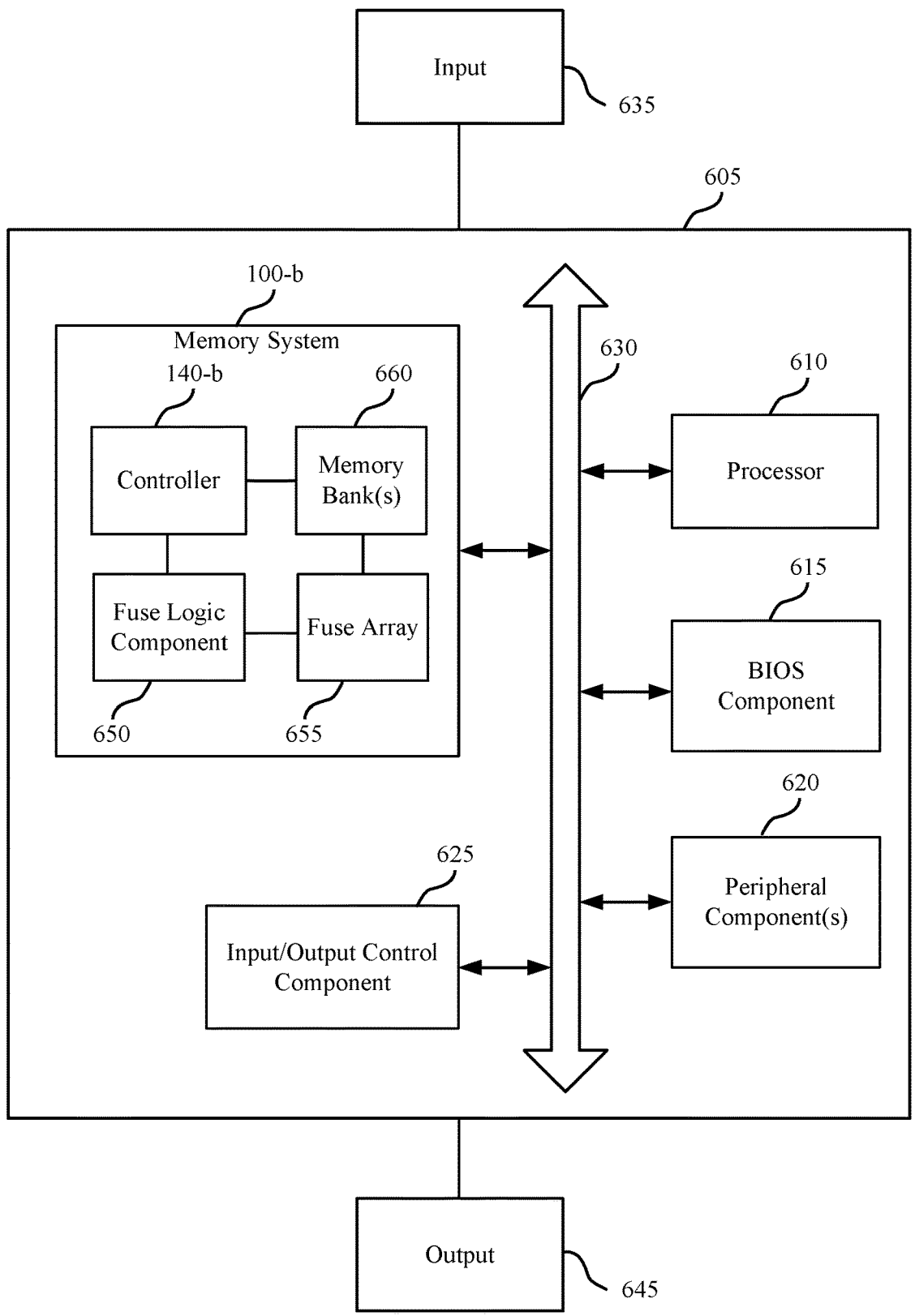
FIG. 6 illustrates an example system that supports modifying memory bank operating parameters in accordance with various embodiments of the present disclosure.

FIG. 6 illustrates an example system that supports modifying memory bank operating parameters in accordance with various embodiments of the present disclosure. System 600 includes a device 605, which may be or include a printed circuit board to connect or physically support various components. Device 605 includes a memory system 100-*b*, which may be an example of memory system 100 described with reference to FIGS. 1 and 5. Memory system 100-*b* may contain memory controller 140-*b*, memory banks 660, fuse logic component 650, and fuse array 655, which may be examples of a memory controller, memory banks, fuse logic component, and fuse array described with reference to FIGS. 1, 2, and 5. Device 605 may also include a processor 610, BIOS component 615, peripheral component(s) 620, and input/output control component 625. The components of device 605 may be in electronic communication with one another through bus 630.

Processor 610 may be configured to operate memory system 100-*b* through memory controller 140-*b*. In some cases, processor 610 may perform the functions of memory controller 140 described with reference to FIGS. 1 and 5. In other cases, memory controller 140-*b* may be integrated into processor 610. Processor 610 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 610 may perform various functions described herein. Processor 610 may, for example, be configured to execute computer-readable instructions stored in memory system 100-*b* to cause device 605 perform various functions or tasks.

BIOS component 615 may be a software component that includes a basic input/output system (BIOS) operated as firmware, which may initialize and run various hardware components of system 600. BIOS component 615 may also manage data flow between processor 610 and the various components, e.g., peripheral components 620, input/output control component 625, etc. BIOS component 615 may include a program or software stored in read-only memory (ROM), flash memory, or any other non-volatile memory.

Peripheral component(s) 620 may be any input or output device, or an interface for such devices, that is integrated into device 605. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 625 may manage data communication between processor 610 and peripheral component(s) 620, input devices 635, or output devices 640. Input/output control component 625 may also manage peripherals not integrated into device 605. In some cases, input/output control component 625 may represent a physical connection or port to the external peripheral.

Input device 635 may represent a device or signal external to device 605 that provides input to device 605 or its components. This may include a user interface or interface with or between other devices. In some cases, input device 635 may be a peripheral that interfaces with device 605 via peripheral component(s) 620 or may be managed by input/output control component 625.

Output device 640 may represent a device or signal external to device 605 configured to receive output from device 605 or any of its components. Examples of output device 640 may include a display, audio speakers, a printing device, another processor or printed circuit board, etc. In some cases, output device 640 may be a peripheral that interfaces with device 605 via peripheral component(s) 620 or may be managed by input/output control component 625.

The components of memory controller 140-*b*, device 605, and memory system 100-*b* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 7:
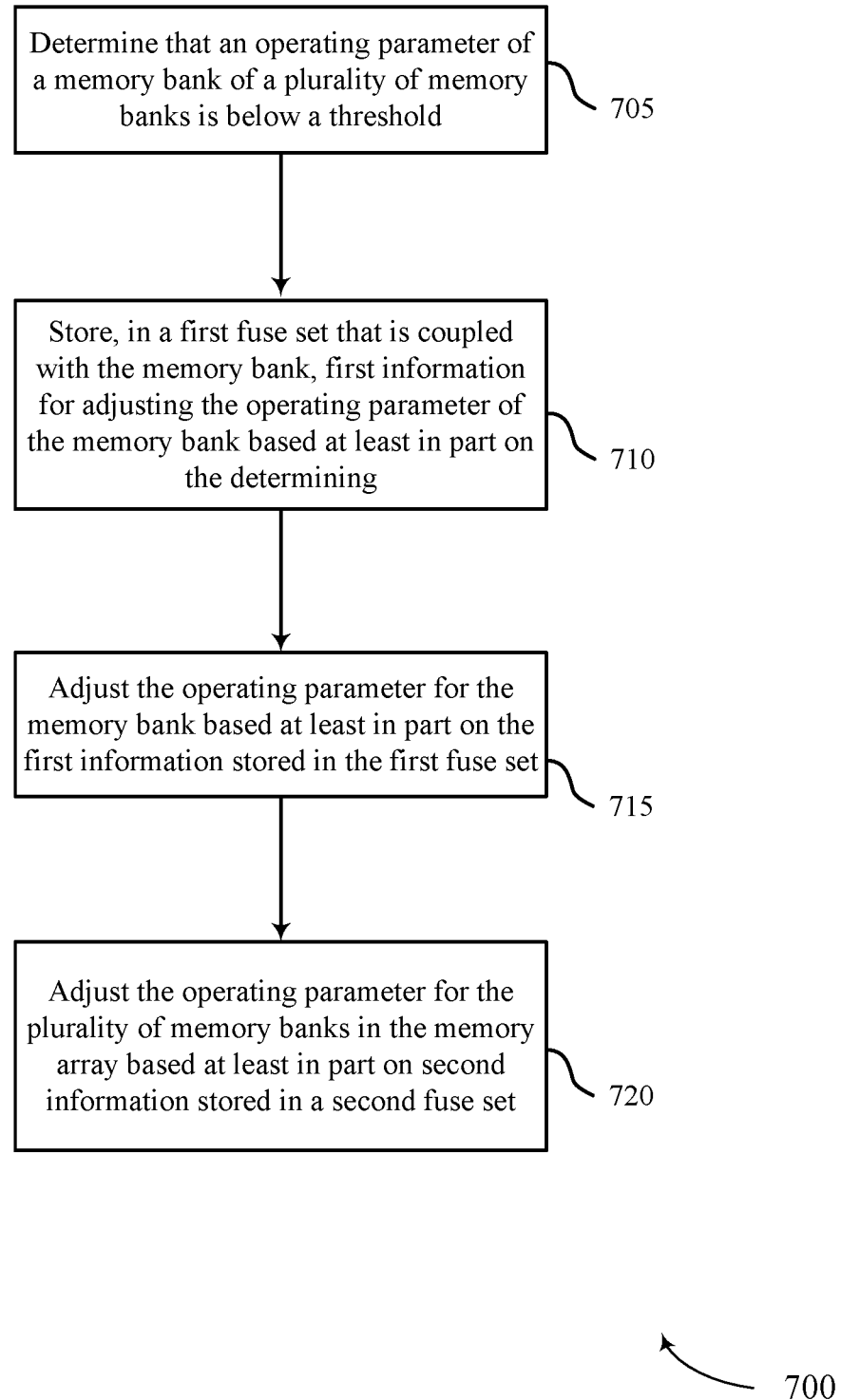
FIGS. 7 and 8 illustrate flowcharts of methods for modifying memory bank operating parameters in accordance with various embodiments of the present disclosure.

FIG. 7 illustrates a flowchart of a method or methods for modifying memory bank operating parameters in accordance with various embodiments of the present disclosure. Method 700 may illustrate aspects of a technique for modifying operating parameters for a memory bank.

At block 705, the method may include determining that an operating parameter of a memory bank of a plurality of memory banks is below a threshold, as described with reference to FIGS. 1-6. In certain examples, the operations of block 705 may be performed or facilitated by a memory controller, as described with reference to FIGS. 1-6.

At block 710, the method may include storing, in a first fuse set that is coupled with the memory bank, first information for adjusting the operating parameter of the memory bank based at least in part on the determining, as described with reference to FIGS. 1-6. In certain examples, the operations of block 710 may be performed or facilitated by a memory controller, as described with reference to FIGS. 1-6.

At block 715, the method may include adjusting the operating parameter for the memory bank based at least in part on the first information stored in the first fuse set, as described with reference to FIGS. 1-6. In certain examples, the operations of block 715 may be performed or facilitated by a memory controller, as described with reference to FIGS. 1-6.

At block 720, the method may include adjusting an operating parameter for the plurality of memory banks in the memory system based at least in part on second information stored in a second fuse set, as described with reference to FIGS. 1-6. In certain examples, the operations of block 720 may be performed or facilitated by a memory controller, as described with reference to FIGS. 1-6.

Figure 8:
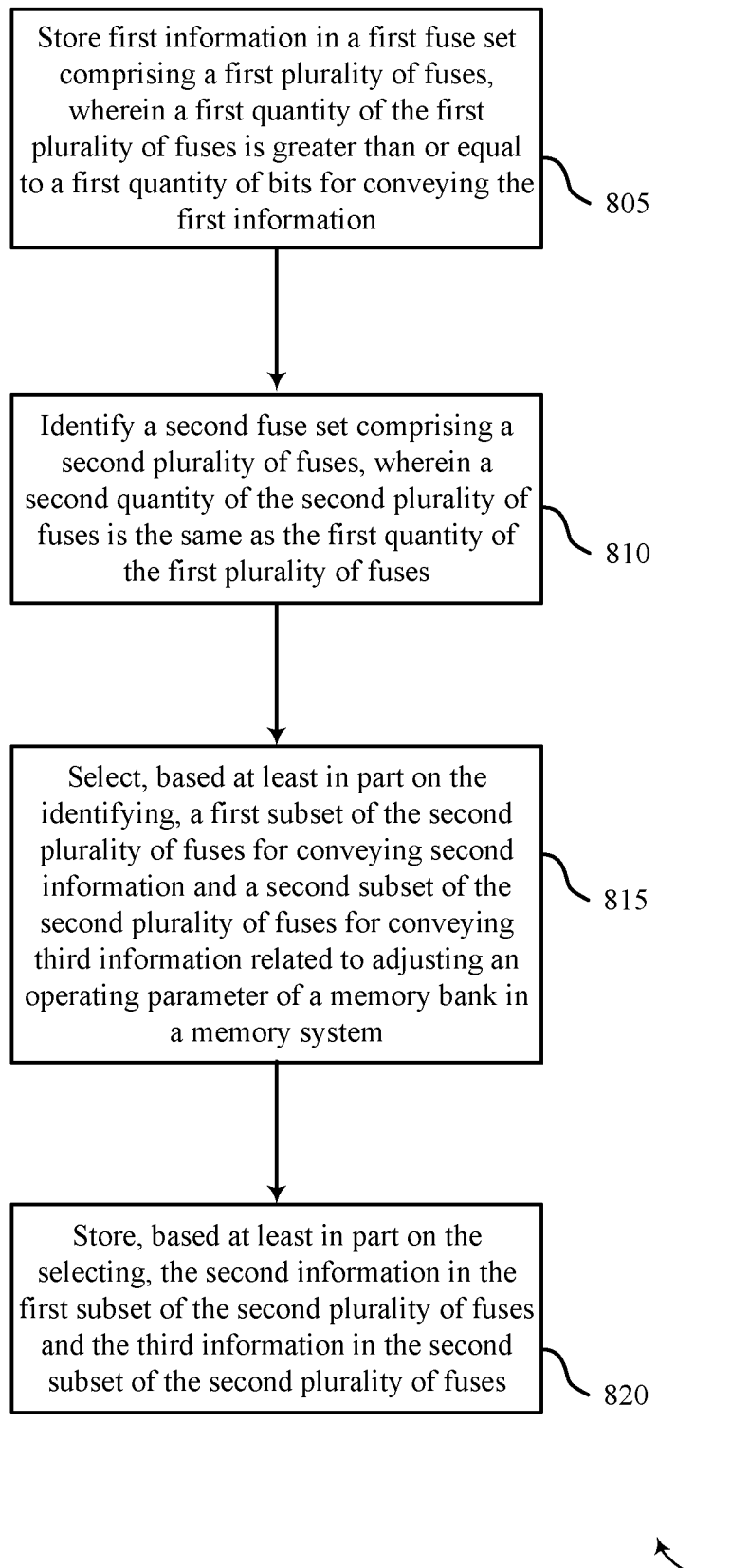

FIG. 8 illustrates a flowchart of a method or methods for modifying memory bank operating parameters in accordance with various embodiments of the present disclosure. Method 800 may illustrate aspects of a technique for storing information for adjusting an operating parameter of a memory bank or memory bank group in unused fuses of a fuse set storing repair information for the memory bank or a memory bank in the memory bank group.

At block 805, the method may include storing first information in a first fuse set comprising a first plurality of fuses, wherein a first quantity of the first plurality of fuses is greater than or equal to a first quantity of bits for conveying the first information, as described with reference to FIGS. 1-6. In certain examples, the operations of block 805 may be performed or facilitated by a memory controller, as described with reference to FIGS. 1-6.

At block 810, the method may include identifying a second fuse set comprising a second plurality of fuses, wherein a second quantity of the second plurality of fuses is the same as the first quantity of the first plurality of fuses, as described with reference to FIGS. 1-6. In certain examples, the operations of block 810 may be performed or facilitated by a memory controller, as described with reference to FIGS. 1-6.

At block 815, the method may include selecting, based at least in part on the identifying, a first subset of the second plurality of fuses for conveying second information and a second subset of the second plurality of fuses for conveying third information related to adjusting an operating parameter of a memory bank in a memory system, as described with reference to FIGS. 1-6. In certain examples, the operations of block 815 may be performed or facilitated by a memory controller, as described with reference to FIGS. 1-6.

At block 820, the method may include storing, based at least in part on the selecting, the second information in the first subset of the second plurality of fuses and the third information in the second subset of the second plurality of fuses, as described with reference to FIGS. 1-6. In certain examples, the operations of block 820 may be performed or facilitated by a memory controller, as described with reference to FIGS. 1-6.

In some examples, an apparatus as described herein may perform a method or methods, such as the method 700. The apparatus may include features, means, or instructions (e.g., a non-transitory computer-readable medium storing instructions executable by a processor) for determining that an operating parameter of a memory bank of a plurality of memory banks is below a threshold; storing, in a first fuse set that is coupled with the memory bank, first information for adjusting the operating parameter of the memory bank based at least in part on the determining; adjusting the operating parameter for the memory bank based at least in part on the first information stored in the first fuse set; and adjusting an operating parameter for the plurality of memory banks in the memory system based at least in part on second information stored in a second fuse set.

In some examples of the method, apparatuses, and non-transitory computer-readable medium described herein, adjusting the operating parameter for the plurality of memory banks occurs before determining that the operating parameter of the memory bank is below the threshold.

In some examples of the method, apparatuses, and non-transitory computer-readable medium described herein, a first adjustment to the operating parameter for the memory bank occurs based at least in part on adjusting the operating parameter for the plurality of memory banks, and wherein a second adjustment to the operating parameter for the memory bank occurs based at least in part on adjusting the operating for the memory bank, the second adjustment being relative to the first adjustment.

Some examples of the method, apparatuses, and non-transitory computer-readable medium described herein may further include operations, features, means, or instructions for sending the first information to the memory system; and latching, based at least in part on sending the first information to the memory system, the first information at a first latch corresponding to the memory bank, wherein adjusting the operating parameter for the memory bank is based at least in part on the latching.

Some examples of the method, apparatuses, and non-transitory computer-readable medium described herein may further include operations, features, means, or instructions for sending the second information to the memory system; latching, based at least in part on sending the second information to the memory system, the second information at a plurality of latches corresponding to the plurality of memory banks, wherein a second latch of the plurality of latches corresponds to the memory bank; and generating a trimming code for the memory bank based at least in part on the first information and the second information, wherein adjusting the operating parameter for the memory bank is based at least in part on the trimming code. In some examples of the method, apparatuses, and non-transitory computer-readable medium described herein, generating the trimming code includes performing an XOR operation of the first information stored in the first latch and the second information stored in the second latch, wherein the trimming code is based at least in part on a result of the XOR operation.

Some examples of the method, apparatuses, and non-transitory computer-readable medium described herein may further include operations, features, means, or instructions for storing, in the first fuse set, third information indicating a defective memory address of the memory bank; sending, from the first fuse set, the first information and the third information to the memory system; and latching, based at least in part on sending the first information and the third information, the first information in a first set of latches corresponding to the memory bank and the third information in a second set of latches corresponding to the memory bank, wherein adjusting the operating parameter for the memory bank is based at least in part on the latching.

Some examples of the method, apparatuses, and non-transitory computer-readable medium described herein may further include operations, features, means, or instructions for comparing the first information and the second information; and transmitting an output of the comparison to a timing component or a biasing component, or both. In some examples of the method, apparatuses, and non-transitory computer-readable medium described herein, adjusting the operating parameter of the memory bank includes modifying, by the timing component, a timing of a memory operation based at least in part on the output of the comparison; or modifying, by the biasing component, one or more voltages or currents applied to components of the memory bank based at least in part on the output of the comparison. In some examples of the method, apparatuses, and non-transitory computer-readable medium described herein, modifying the timing of the memory operation includes delaying an application of the one or more voltages or currents to the components of the memory bank, or modifying the one or more voltages or currents includes modifying a magnitude of the one or more voltages or currents before applying the one or more voltages or currents to the components of the memory bank.

In some examples of the method, apparatuses, and non-transitory computer-readable medium described herein, the operating parameter includes a timing of one or more voltages or currents applied within a memory bank, or one or more of magnitudes for one or more voltages or currents applied to components of the memory bank and one or more slew rates for the one or more voltages or currents applied to the components of the memory bank, or any combination thereof.

In some examples of the method, apparatuses, and non-transitory computer-readable medium described herein, adjusting the operating parameter for the memory bank includes adjusting the operating parameter for a subset of the plurality of memory banks.

In some examples, an apparatus as described herein may perform a method or methods, such as the method 800. The apparatus may include features, means, or instructions (e.g., a non-transitory computer-readable medium storing instructions executable by a processor) for storing first information in a first fuse set comprising a first plurality of fuses, wherein a first quantity of the first plurality of fuses is greater than or equal to a first quantity of bits for conveying the first information; identifying a second fuse set comprising a second plurality of fuses, wherein a second quantity of the second plurality of fuses is the same as the first quantity of the first plurality of fuses; selecting, based at least in part on the identifying, a first subset of the second plurality of fuses for conveying second information and a second subset of the second plurality of fuses for conveying third information related to adjusting an operating parameter of a memory bank in a memory system; and storing, based at least in part on the selecting, the second information in the first subset of the second plurality of fuses and the third information in the second subset of the second plurality of fuses.

Some examples of the method, apparatuses, and non-transitory computer-readable medium described herein may further include operations, features, means, or instructions for mapping the first subset of the second plurality of fuses to a first set of latches for the memory bank and the second subset of the second plurality of fuses to a second set of latches for the memory bank, wherein the selecting is based at least in part on the mapping; broadcasting the second information and the third information throughout the memory system based at least in part on the mapping; and latching the second information at the first set of latches and the third information at the second set of latches based at least in part on the broadcasting.

Some examples of the method, apparatuses, and non-transitory computer-readable medium described herein may further include operations, features, means, or instructions for broadcasting the first information throughout the memory system during a first time period; and concurrently broadcasting the second information and the third information throughout the memory system during a second time period.

Some examples of the method, apparatuses, and non-transitory computer-readable medium described herein may further include operations, features, means, or instructions for adjusting the operating parameter for the memory bank based at least in part on the third information.

In some examples of the method, apparatuses, and non-transitory computer-readable medium described herein, a second quantity of bits for conveying the second information is less than the first quantity of bits. And in some examples of the method, apparatuses, and non-transitory computer-readable medium described herein may further include operations, features, means, or instructions for determining that the second quantity of the second plurality of fuses is greater than the second quantity of bits, wherein selecting the second subset of the second plurality of fuses to the third information is based on the determining.

Some examples of the method, apparatuses, and non-transitory computer-readable medium described herein may further include operations, features, means, or instructions for determining that the first quantity of bits is greater than a second quantity of bits for conveying the second information; selecting the first quantity of the first plurality of fuses and the second quantity of the second plurality of fuses to be equal to the first quantity of bits based at least in part on the determining; and configuring a communications bus to support the first quantity of bits based at least in part on the determining.

In some examples of the method, apparatuses, and non-transitory computer-readable medium described herein, the first information comprises a first memory address of a first defective memory element, the second information comprises a second memory address of a second defective memory element, and the third information comprises a trimming code for the memory bank, wherein a second quantity of bits for conveying the second information is less than the first quantity of bits, and wherein a third quantity of bits for conveying the third information is less than the second quantity of bits.

It should be noted that the methods described above describe possible implementations, and that the operations and the steps may be rearranged or otherwise modified and that other implementations are possible. Furthermore, embodiments from two or more of the methods may be combined.

In some examples, an apparatus or device may perform aspects of the functions described herein using general or special-purpose hardware. For example, an apparatus or device may include a plurality of memory banks; a first fuse set configured to convey first information for adjusting an access parameter of multiple memory banks of the plurality of memory banks; a second fuse set configured to convey second information for adjusting the access parameter of a memory bank of the plurality of memory banks; and a first latch coupled with the second fuse set and the memory bank and configured to receive the second information from the second fuse set and store the second information for the memory bank.

In some examples, the apparatus or device includes a plurality of latches coupled with the first fuse set and comprising a second latch that is coupled with the memory bank and that is configured to receive the first information from the first fuse set and store the first information; and a fuse logic component configured to send the first information to the second plurality of latches and the second information to the first latch.

In some examples, the apparatus or device includes a logic component configured to receive the first information from the second latch and the second information from the first latch and to generate a trimming code for the memory bank based at least in part on the first information and the second information.

In some examples, the apparatus or device includes a fuse bank comprising a plurality of fuse sets, wherein the plurality of fuse sets comprises the first fuse set and the second fuse set, and wherein the fuse bank is centrally located relative to the plurality of memory banks.

In some examples of the apparatus or device, the second fuse set is further configured to convey second information for a subset of the plurality of memory banks.

In some examples of the apparatus or device, the second fuse set is further configured to convey third information indicating a defective memory address. And in some examples, the apparatus or device includes a second latch configured to receive and store the third information for the memory bank; a fuse logic component configured to concurrently broadcast the second information to the first latch and the third information to the second latch; and a repair component configured to identify whether a received memory address matches the defective memory address and to access a different memory address storing redundant information.

In some examples, the apparatus or device includes a delay component configured to delay a signal within the memory bank; and a biasing component configured to modify a voltage or current of the signal within the memory bank.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory system 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. An apparatus, comprising:
   a memory bank;
   a plurality of latches coupled with the memory bank;
   a first fuse set comprising a first plurality of fuses, wherein the first plurality of fuses comprises a first quantity of fuses and is operable to store at least one address identifying a defective memory element of the memory bank;
   a second fuse set comprising a second plurality of fuses, wherein a first subset of the second plurality of fuses is operable to store local trimming information for the memory bank and a second subset of the second plurality of fuses is operable to store repair information for the memory bank; and
   a fuse logic component coupled with the first fuse set, the second fuse set, and the plurality of latches, the fuse logic component operable to access and transmit the at least one address, the local trimming information, and the repair information to the plurality of latches.

2. The apparatus of claim 1, wherein the first subset of the second plurality of fuses is mapped to a first set of latches of the plurality of latches, and the first set of latches is operable to receive and store the local trimming information, and wherein a second quantity of the second plurality of fuses is the same as the first quantity of fuses.

3. The apparatus of claim 1, wherein a second subset of the second plurality of fuses is operable to store repair information for the memory bank, and the fuse logic component is operable to access and transmit the repair information to the plurality of latches.

4. The apparatus of claim 3, wherein the second subset of the second plurality of fuses is mapped to a second set of latches of the plurality of latches, and the second set of latches is operable to receive and store the repair information.

5. The apparatus of claim 4, wherein the fuse logic component is operable to transmit the local trimming information and the repair information to the plurality of latches by broadcasting the local trimming information with the repair information.

6. The apparatus of claim 1, further comprising:
a controller coupled with the memory bank and with the fuse logic component, wherein the controller is operable to cause the apparatus to adjust an operating parameter of the memory bank based at least in part on the local trimming information.

7. The apparatus of claim 6, further comprising:
a third fuse set comprising a third plurality of fuses that is operable to store global trimming information, wherein the controller is further operable to adjust the operating parameter of the memory bank based at least in part on the local trimming information and the global trimming information associated with the third fuse set.

8. The apparatus of claim 1, wherein a first quantity of bits for conveying the address identifying the defective memory element of the memory bank is greater than a second quantity of bits for conveying the local trimming information for the memory bank, and wherein the first plurality of fuses, the second plurality of fuses, or both, are greater than or equal to the first quantity of bits for conveying the address identifying the defective memory element of the memory bank.

9. An apparatus, comprising:
a memory bank;
a plurality of latches coupled with the memory bank;
a first fuse set comprising a first quantity of fuses;
a second fuse set comprising a second quantity of fuses;
a fuse logic component coupled with the first fuse set, the second fuse set, and the plurality of latches, the fuse logic component operable to access and transmit information from the first fuse set and the second fuse set to the plurality of latches; and
a controller coupled with the first fuse set, the second fuse set, and the plurality of latches, the controller operable to cause the apparatus to:
store, in the first fuse set, at least one address identifying a defective memory element of the memory bank;
store, in a first subset of the second quantity of fuses of the second fuse set, local trimming information for the memory bank; and
store, in a second subset of the second quantity of fuses of the second fuse set, repair information for the memory bank.

10. The apparatus of claim 9, wherein the controller is further operable to cause the apparatus to:
map the first quantity of fuses to a first set of latches of the plurality of latches operable to receive and store the at least one address;
map the first subset of the second quantity of fuses to a second set of latches of the plurality of latches operable to receive and store the local trimming information; and
map the second subset of the second quantity of fuses to a third set of latches of the plurality of latches operable to receive and store the repair information.

11. The apparatus of claim 10, wherein the fuse logic component is further operable to cause the apparatus to:
transmit, to the first set of latches, the at least one address identifying the defective memory element;
transmit, to the second set of latches, the local trimming information; and
transmit, to the third set of latches of the plurality of latches, the repair information, wherein the second quantity of fuses is the same as the first quantity of fuses.

12. The apparatus of claim 11, wherein the fuse logic component is further operable to cause the apparatus to:
broadcast the local trimming information with the repair information to the plurality of latches.

13. The apparatus of claim 9, further comprising:
a trimming component operable to adjust an operating parameter of the memory bank based at least in part on the local trimming information.

14. The apparatus of claim 9, further comprising:
a third fuse set comprising a third quantity of fuses that is operable to store global trimming information.

15. The apparatus of claim 14, wherein the controller is further operable to cause the apparatus to:
generate a local trimming code for the memory bank based at least in part on the local trimming information and the global trimming information.

16. The apparatus of claim 9, wherein a first quantity of bits for conveying the address identifying the defective memory element of the memory bank is greater than a second quantity of bits for conveying the local trimming information for the memory bank, and wherein the first quantity of fuses, the second quantity of fuses, or both, are greater than or equal to the first quantity of bits for conveying the address identifying the defective memory element of the memory bank.

17. An apparatus, comprising:
a plurality of memory banks;
a plurality of latches each coupled with a respective memory bank of the plurality of memory banks;
a first fuse set coupled with at least a first memory bank of the plurality of memory banks and comprising a first plurality of fuses that is operable to store a row address identifying a first defective memory element of the first memory bank, wherein a first quantity of the first plurality of fuses is equal to a quantity of bits for conveying the row address;
a second fuse set coupled with at least a second memory bank of the plurality of memory banks and comprising a second plurality of fuses that is operable to store repair information and local trimming information for the second memory bank, the repair information comprising at least one column address identifying a second defective memory element of the second memory bank; and
a fuse logic component coupled with the first fuse set, the second fuse set, and the plurality of latches, the fuse logic component operable to cause the apparatus to:
transmit, to at least a first latch coupled with the first memory bank, the row address;
transmit, to at least a second latch coupled with the second memory bank, the repair information; and
transmit, to at least a third latch coupled with the second memory bank, the local trimming information for the second memory bank.

18. The apparatus of claim 17, wherein a first subset of the second plurality of fuses is operable to store the repair information, and a second subset of the second plurality of fuses is operable to store the local trimming information, and wherein a second quantity of the second plurality of fuses is equal to the first quantity.

19. The apparatus of claim 18, wherein the first subset of the second plurality of fuses is mapped to at least the second latch, and the second subset of the second plurality of fuses is mapped to at least the third latch.

20. The apparatus of claim 17, wherein the fuse logic component is further operable to cause the apparatus to:
broadcast the repair information with the local trimming information.

* * * * *